(12) United States Patent
Yoo et al.

(10) Patent No.: US 11,393,846 B2
(45) Date of Patent: Jul. 19, 2022

(54) FERROELECTRIC MEMORY DEVICE HAVING FERROELECTRIC INDUCTION LAYER AND METHOD OF MANUFACTURING THE SAME

(71) Applicant: SK hynix Inc., Icheon-si (KR)

(72) Inventors: Hyangkeun Yoo, Seongnam-si (KR); Seho Lee, Yongin-si (KR); Jae-Gil Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/822,907

(22) Filed: Mar. 18, 2020

(65) Prior Publication Data

US 2021/0043654 A1 Feb. 11, 2021

(30) Foreign Application Priority Data

Aug. 6, 2019 (KR) .................. 10-2019-0095789

(51) Int. Cl.
| | | |
|---|---|---|
| *H01L 27/11* | (2006.01) | |
| *H01L 27/11585* | (2017.01) | |
| *H01L 29/78* | (2006.01) | |
| *G11C 11/22* | (2006.01) | |

(52) U.S. Cl.
CPC ...... *H01L 27/11585* (2013.01); *G11C 11/223* (2013.01); *H01L 29/78391* (2014.09)

(58) Field of Classification Search
CPC ......... H01L 27/11585; H01L 29/78391; H01L 27/11597; H01L 29/6684; H01L 29/42364; H01L 29/401; H01L 29/516; H01L 27/1159; H01L 21/02356; H01L 21/02181; H01L 21/02189; H01L 21/02194; H01L 27/11595; G11C 11/223; G11C 11/5657

See application file for complete search history.

(56) References Cited

U.S. PATENT DOCUMENTS

| | | | |
|---|---|---|---|
| 8,890,112 B2 | 11/2014 | Dubourdieu et al. | |
| 2004/0129987 A1* | 7/2004 | Uchiyama | H01L 21/02197 257/395 |
| 2009/0261395 A1* | 10/2009 | Boescke | H01L 21/02181 257/295 |
| 2014/0138753 A1* | 5/2014 | Ramaswamy | G11C 14/0027 257/295 |
| 2016/0027490 A1* | 1/2016 | Muller | H01L 29/78391 365/145 |
| 2016/0365133 A1* | 12/2016 | Ino | G11C 11/223 |
| 2017/0040331 A1* | 2/2017 | Van Houdt | H01L 29/516 |
| 2018/0130823 A1* | 5/2018 | Kim | H01L 29/6684 |
| 2018/0166453 A1* | 6/2018 | Muller | H01L 28/40 |
| 2019/0148390 A1* | 5/2019 | Frank | H01L 21/02181 257/295 |

(Continued)

FOREIGN PATENT DOCUMENTS

KR    1020180106662 A    10/2018

*Primary Examiner* — Charles D Garber
*Assistant Examiner* — S M Sohel Imtiaz

(57) ABSTRACT

A ferroelectric memory device according to an aspect of the present disclosure includes a substrate having a channel layer, a first ferroelectric layer disposed on the channel layer, a ferroelectric induction layer disposed on the first ferroelectric layer, the ferroelectric induction layer including an insulator, a second ferroelectric layer disposed on the ferroelectric induction layer, and a gate electrode layer disposed on the second ferroelectric layer.

14 Claims, 35 Drawing Sheets

(56) References Cited

U.S. PATENT DOCUMENTS

| | | | |
|---|---|---|---|
| 2020/0075075 A1* | 3/2020 | Chen | H01L 29/78391 |
| 2020/0202916 A1* | 6/2020 | Lee | H01L 27/11597 |
| 2020/0365618 A1* | 11/2020 | Zhang | H01L 27/11597 |
| 2020/0411072 A1* | 12/2020 | Zhang | H01L 27/11597 |
| 2021/0036018 A1* | 2/2021 | Rajashekhar | H01L 27/1159 |

* cited by examiner

FERROELECTRIC MEMORY DEVICE HAVING FERROELECTRIC INDUCTION LAYER AND METHOD OF MANUFACTURING THE SAME

CROSS-REFERENCE TO RELATED APPLICATION

The present application claims priority under 35 U.S.C. § 119(a) to Korean Patent Application No. 10-2019-0095789, filed on Aug. 6, 2019, which is herein incorporated by reference in its entirety.

BACKGROUND

1. Technical Field

The present disclosure relates generally to a ferroelectric memory device and a method of manufacturing the same and, more particularly, to a ferroelectric memory device having a ferroelectric induction layer and a method of manufacturing the same.

2. Related Art

Generally, a ferroelectric material refers to a material having spontaneous electrical polarization in the absence of an external electric field. In addition, the electrical polarization of the ferroelectric material may exhibit a hysteresis behavior when an external electric field is applied. Accordingly, various polarization states can be recorded in the ferroelectric material along a hysteresis curve by controlling the applied electric field. The recorded polarization can be stored in the ferroelectric material in a nonvolatile manner after the applied electric field is removed. This characteristic can be applied to a memory device that stores signal information in a nonvolatile manner.

Recently, a ferroelectric memory device in the form of a field effect transistor applying a ferroelectric material as a gate dielectric layer has been studied. The write operation of the ferroelectric memory device may be performed by applying a predetermined write voltage to a gate electrode layer to record different remanent polarization states as logic information in a gate dielectric layer. The read operation of the ferroelectric memory device may be performed by reading channel currents having different magnitudes passing through a channel layer of the field effect transistor using the property that the channel resistance of the field effect transistor changes according to the different remanent polarization states recorded in the gate dielectric layer.

SUMMARY

A ferroelectric memory device according to an aspect of the present disclosure includes a substrate having a channel layer, a first ferroelectric layer disposed on the channel layer, a ferroelectric induction layer disposed on the first ferroelectric layer, the ferroelectric induction layer including an insulator, a second ferroelectric layer disposed on the ferroelectric induction layer, and a gate electrode layer disposed on the second ferroelectric layer.

A ferroelectric memory device according to another aspect of the present disclosure includes a substrate, a gate stack disposed on the substrate, the gate stack comprising at least one gate structure and at least one interlayer insulation layer, which are alternately stacked in a direction perpendicular to the substrate, a trench penetrating the gate stack to expose side surfaces of the gate structure and interlayer insulation layer, a first gate dielectric layer disposed on an inner surface of the trench, the first gate dielectric layer comprising a ferroelectric portion and a non-ferroelectric portion, and a channel layer disposed to cover the first gate dielectric layer. The gate structure includes a ferroelectric induction layer in contact with the interlayer insulation layer and the first gate dielectric layer, a second gate dielectric layer in contact with the ferroelectric induction layer, and a gate electrode layer in contact with the second gate dielectric layer.

A ferroelectric memory device according to yet another aspect of the present disclosure includes a substrate, a gate stack disposed on the substrate, the gate stack comprising at least one gate structure and at least one interlayer insulation layer, which are alternately stacked in a direction perpendicular to the substrate, a trench penetrating the gate stack to expose side surfaces of the gate structure and the at least one interlayer insulation layer, a first gate dielectric layer disposed on an inner surface of the trench, a ferroelectric induction layer disposed on the first gate dielectric layer along the inner surface of the trench, a second gate dielectric layer disposed on the ferroelectric induction layer along the inner surface of the trench, and a channel layer disposed to cover the second gate dielectric layer. The gate structure comprises an interlayer insulation layer and a gate electrode layer in contact with the first gate dielectric layer.

A method of manufacturing a ferroelectric memory device according to yet another aspect of the present disclosure is disclosed. In the method, a stack structure including interlayer sacrificial layers and interlayer insulation layers, alternately stacked is formed on a substrate. A trench penetrating the stack structure is formed. A first ferroelectric amorphous material layer and a channel layer are sequentially formed on an inner surface of the trench. The interlayer sacrificial layers are selectively removed to form recesses that expose the interlayer insulation layers and the first ferroelectric amorphous material layer. A ferroelectric induction layer is formed on the first ferroelectric amorphous material layer and the interlayer insulation layers, inside each of the recesses. A second ferroelectric amorphous material layer in contact with the ferroelectric induction layer, inside the recesses is formed. A gate electrode layer in contact with the second ferroelectric amorphous material layer, inside the recesses is formed. A crystallization heat treatment is performed to develop ferroelectric properties in portion of the first ferroelectric amorphous material layer and the second ferroelectric amorphous material layers using the ferroelectric induction layer.

A method of manufacturing a ferroelectric memory device according to still yet another aspect of the present disclosure is disclosed. In the method, a stack structure including interlayer sacrificial layers and interlayer insulation layers, which are sequentially stacked is formed on a substrate. A trench penetrating the stack structure is formed. A first ferroelectric amorphous material layer, a ferroelectric induction layer, a second ferroelectric amorphous material layer and a channel layer are sequentially formed on an inner surface of the trench. The interlayer sacrificial layers are selectively removed to form recesses that expose the interlayer insulation layers and the first ferroelectric amorphous material layer. A gate electrode layer is formed on the first ferroelectric amorphous material layer and the interlayer insulation layers, inside each of the recesses. A crystallization heat treatment is performed to develop ferroelectric properties in portion of the first ferroelectric amorphous material layer and the second ferroelectric amorphous material layers using the ferroelectric induction layer.

BRIEF DESCRIPTION OF THE DRAWINGS

FIGS. 8 to 11, FIGS. 12A to 16A, and FIGS. 12B to 16B are cross-sectional views schematically illustrating a method of manufacturing a ferroelectric memory device according to an embodiment of the present disclosure.

FIGS. 18A to 22A and FIGS. 18B to 22B are cross-sectional views schematically illustrating a method of manufacturing a ferroelectric memory device according to an embodiment of the present disclosure.

DETAILED DESCRIPTION

Figure 1A:
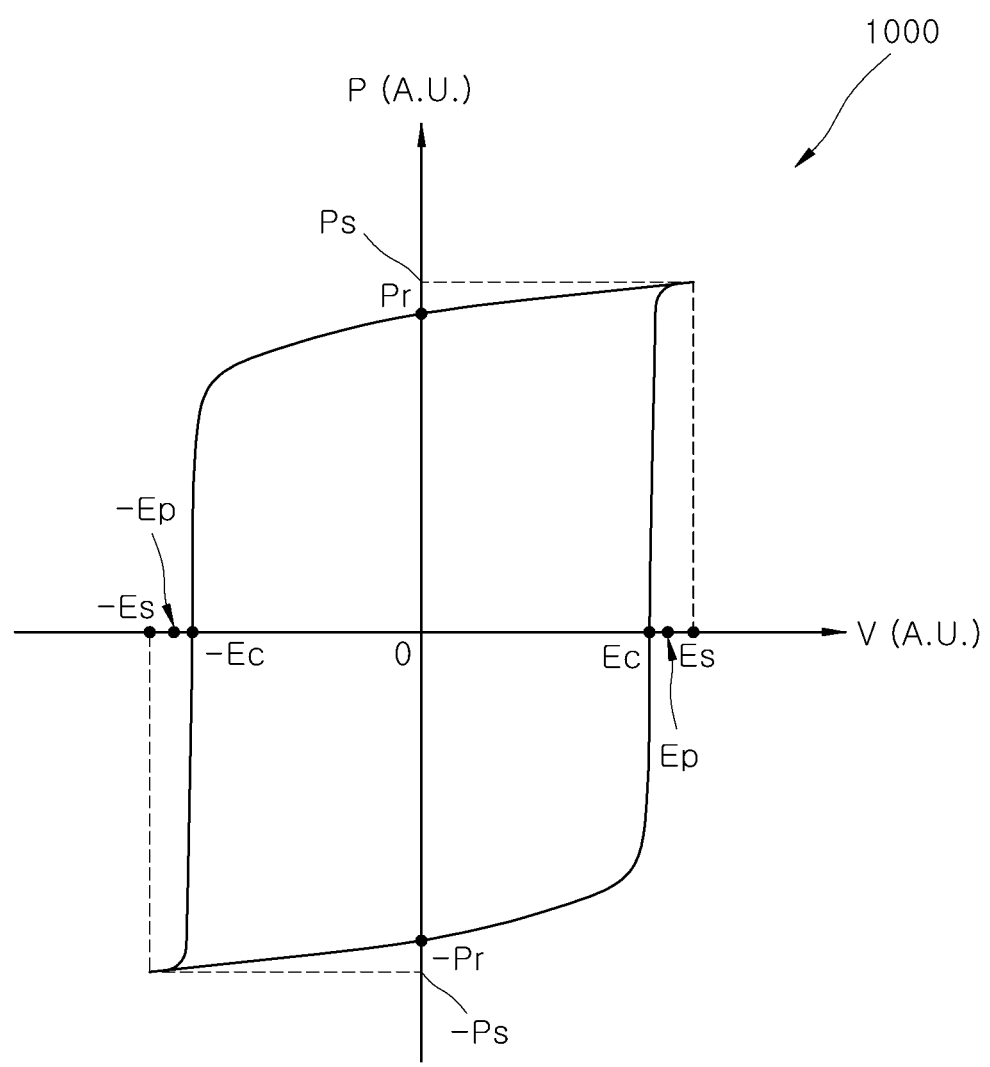
FIG. 1A is a hysteresis graph schematically illustrating a polarization characteristic of a ferroelectric layer under an applied electric field according to an embodiment of the present disclosure.

Various embodiments will now be described hereinafter with reference to the accompanying drawings. In the drawings, the dimensions of layers and regions may be exaggerated for clarity of illustration. As a whole, the drawings are described at an observer's viewpoint. If an element is referred to be located "on" or "under" another element, it may be understood that the element is directly located "on" or "under" the other element, or an additional element may be interposed between the element and the other element. The same reference numerals in the drawings refer to substantially the same elements as each other.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

Figure 1B:
FIG. 1B illustrates a ferroelectric device structure for measuring a polarization characteristic of a ferroelectric layer illustrated in FIG. 1A.

FIG. 1A is a hysteresis graph 1000 schematically illustrating a polarization characteristic of a ferroelectric layer under an applied electric field according to an embodiment of the present disclosure. FIG. 1B illustrates a ferroelectric device structure for measuring the polarization characteristic of the ferroelectric layer illustrated in FIG. 1A.

Referring to FIG. 1B, a ferroelectric device structure 1000S may include a first electrode 1001, a ferroelectric layer 1002, and a second electrode 1003. The ferroelectric layer 1002 may be applied to ferroelectric memory devices 1, 2, 3 and 4 according to embodiments of the present disclosure as first and second ferroelectric layers, respectively.

Referring to FIGS. 1A and 1B, when an electric field is applied between the first and second electrodes 1001 and 1003 of the ferroelectric device structure 1000S, polarization of the ferroelectric layer 1002 may have a characteristic that follows the hysteresis graph 1000 with respect to the applied electric field. The hysteresis graph 1000 may represent a pair of first and second coercive electric fields Ec and −Ec, and a pair of first and second remanent polarization Pr and −Pr. At this time, the first remanent polarization Pr may have a first polarization orientation, and the second remanent polarization −Pr may have a second polarization orientation. In addition, the hysteresis graph 1000 may represent a pair of saturation polarization Ps and −Ps at a pair of respective saturation electric fields Es and −Es.

In an embodiment, for the ferroelectric layer 1002 having the second remanent polarization −Pr, while the second electrode 1003 is grounded, the polarization of the ferroelectric layer 1002 may be measured by sequentially applying an electric field having a positive polarity to the first electrode 1001 while increasing the electric field. When the applied electric field increases to a first coercive electric field Ec or higher, the polarization orientation of the ferroelectric layer 1002 can be changed from the second polarization orientation to the first polarization orientation. In addition, when the applied electric field increases to the first saturation electric field Es or higher, the ferroelectric layer 1002 may have the first saturation polarization Ps. After the applied electric field is removed, the ferroelectric layer 1002 may have the first remanent polarization Pr.

In another embodiment, for the ferroelectric layer 1002 having the first remanent polarization Pr, while the second electrode 1003 is grounded, the polarization of the ferroelectric layer 1002 may be measured by sequentially applying an electric field having a negative polarity to the first electrode 1001 while increasing an absolute value of the electric field. When the absolute value of the applied electric field increases to an absolute value of the second coercive electric field −Ec or higher, the polarization orientation of the ferroelectric layer 1002 may be changed from the first polarization orientation to the second polarization orientation. In addition, when the absolute value of the applied electric field increases to the second saturation electric field −Es or higher, the ferroelectric layer 1002 may have the second saturation polarization −Ps. After the applied electric field is removed, the ferroelectric layer 1002 may have the second remanent polarization −Pr.

In other embodiments, as a method of changing the second remanent polarization −Pr in ferroelectric layer 1002 to the first saturation polarization Ps, a method is used in which a predetermined first operation electric field Ep having a magnitude greater than or equal to the first coercive electric field Ec is applied to the ferroelectric layer 1002 for a predetermined first operation time period tp1. The predetermined first operation time period tp1 may be a time sufficient to switch the second polarization orientation in the ferroelectric layer 1002 to the first polarization orientation. Thereafter, the ferroelectric layer 1002 may have the first remanent polarization Pr by removing the first operation electric field Ep. As an example, the electric field may be applied in a form of a pulse wave.

In yet other embodiments, multi-level polarization can be recorded in the ferroelectric layer 1002 by controlling the time during which the first operation electric field Ep is applied to the ferroelectric layer 1002. For instance, the ferroelectric layer 1002 may be adjusted to have polarization between zero (0) and the first saturation polarization Ps by applying a first operation electric field Ep to the ferroelectric layer 1002, having a second remanent polarization −Pr, for a time period shorter than the first operation time period tp1. Thereafter, when the first operation electric field Ep is removed, the ferroelectric layer 1002 may have predetermined remanent polarization between 0 and the first remanent polarization Pr. By the above-described method, the multilevel remanent polarization corresponding to signal information can be stored in the ferroelectric layer 1002.

Likewise, a predetermined second operation electric field −Ep greater than or equal to the second coercive electric field −Ec in absolute value may be applied to the ferroelectric layer 1002 having the first remanent polarization Pr for a predetermined second operation time period tp2, thereby causing the ferroelectric layer 1002 to have the second saturation polarization −Ps. In this case, the predetermined second operation time period tp2 may be a time sufficient to switch the first polarization orientation in the ferroelectric layer 1002 into the second polarization orientation. Thereafter, when the second operation electric field −Ep is removed, the ferroelectric layer 1002 may have the second remanent polarization −Pr. Accordingly, the multilevel polarization can be recorded in the ferroelectric layer 1002 by controlling the time during which the second operation electric field −Ep is applied to the ferroelectric layer 1002.

For example, the ferroelectric layer 1002 may be adjusted to have polarization between 0 and the second saturation polarization −Ps by applying a second operation electric field −Ep to the ferroelectric layer 1002, having a second remanent polarization −Pr, for a time period shorter than the second operation time period tp2. Thereafter, when the second operation electric field −Ep is removed, the ferroelectric layer 1002 may have a predetermined remanent polarization between 0 and the second remanent polarization −Pr. By the above-described methods, multilevel remanent polarization corresponding to different signal information can be stored in the ferroelectric layer 1002.

When a plurality of operation voltages are actually applied to the ferroelectric layer 1002 to record multilevel polarization, a voltage gap between the plurality of operation voltages must be large enough to sufficiently identify polarization of adjacent levels among the multiple levels. In addition, in order to increase the number of the multilevels, it may be required to increase the number of different operation voltages that may be applied to the ferroelectric layer 1002. For these reasons, larger absolute values of the first and second remanent polarization Pr and −Pr and the corresponding absolute values of the first and second saturation polarization Ps and −Ps may be advantageous.

As described above, the maximum range of the operation voltages applied to the ferroelectric layer 1002 to record the remanent polarization distinguished from each other may be defined as a memory window. The memory window may be determined by multiplying two (2)×absolute value of coercive electric field of the ferroelectric layer×thickness of the ferroelectric layer. In this case, the coercive electric field of the ferroelectric layer may be due to a material property of the ferroelectric layer. Accordingly, after the ferroelectric material used in the ferroelectric layer is determined, the memory window may become larger as the thickness of the ferroelectric layer increases.

Meanwhile, in an embodiment of the present disclosure, the ferroelectric layer of the ferroelectric memory device may include hafnium oxide, zirconium oxide, hafnium zirconium oxide, or a combination of two or more ferroelectric materials thereof. It has been reported that a ferroelectric material having a tetragonal crystal structure exhibits a ferroelectric property at a thickness of about fifteen nanometers (15 nm) or less, and a ferroelectric material having a monoclinic crystal structure exhibits a non-ferroelectric property at a thickness exceeding about 15 nm. Accordingly, when an above-described ferroelectric material is used in a ferroelectric layer disclosed herein, the thickness of the ferroelectric layer can be controlled to about 15 nm or less.

In an embodiment of the present disclosure, there is disclosed a structure of a ferroelectric memory device capable of increasing the effective thickness of the ferroelectric layer to a thickness exceeding about 15 nm, while maintaining ferroelectric properties of the ferroelectric layers, by including a ferroelectric induction layer. This can effectively increase the memory window of the ferroelectric memory device.

Figure 2:
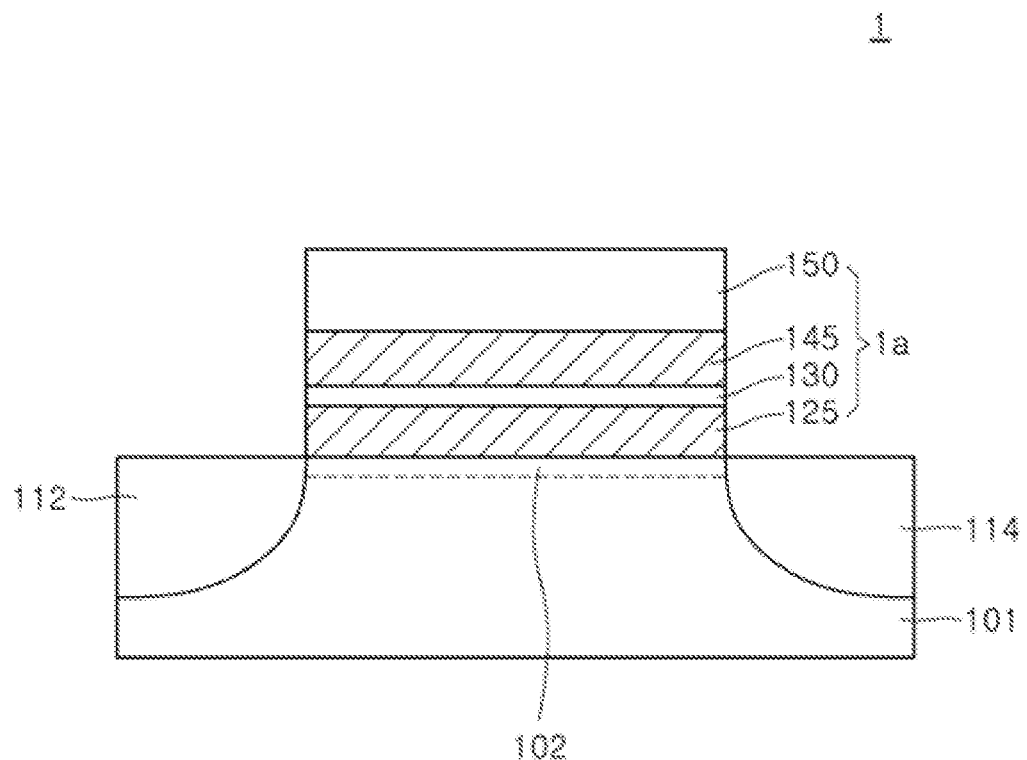
FIG. 2 is a cross-sectional view schematically illustrating a ferroelectric memory device according to an embodiment of the present disclosure.

FIG. 2 is a cross-sectional view schematically illustrating a ferroelectric memory device according to an embodiment of the present disclosure.

Referring to FIG. 2, a ferroelectric memory device 1 may include a substrate 101 and a gate structure 1a disposed on the substrate 101. The gate structure 1a may include a first ferroelectric layer 125, a ferroelectric induction layer 130, a second ferroelectric layer 145, and a gate electrode layer 150. In addition, the ferroelectric memory device 1 may include a channel layer 102 positioned in a substrate 10 region under the first ferroelectric layer 125. Further, the ferroelectric memory device 1 may include a source region 112 and a drain region 114 respectively positioned in regions of the substrate 101 at different ends of the channel layer 102. In an embodiment, the ferroelectric memory device 1 may be a field effect transistor-type nonvolatile memory device.

The substrate 101 may include, for example, a semiconductor material. The substrate 101 may be a silicon (Si) substrate, a gallium arsenide (GaAs) substrate, an indium phosphide (InP) substrate, a germanium (Ge) substrate, or a silicon germanium (SiGe) substrate, for example. In an embodiment, the substrate 101 may be doped to have conductivity. As an example, the substrate 101 may be doped with an n-type or p-type dopant. As another example, the substrate 101 may include a well region doped with an n-type or p-type dopant therein.

The source region 112 and the drain region 114 may be regions of the substrate 101, doped into n-type or p-type. When the substrate 101 is doped into n-type or p-type, the source region 112 and the drain region 114 may be regions doped with a dopant of a type opposite to that used in the substrate 101. The channel layer 102 may be a region of the substrate 101 in which a carrier with charge conducts when a voltage is applied between the source region 112 and the drain region 114. For example, the channel layer 102 may refer to an area of the substrate 101 having high mobility of electrons or holes.

The first ferroelectric layer 125 may be disposed on the channel layer 102. The first ferroelectric layer 125 may have substantially the same ferroelectric property as the ferroelectric layer 1002 described above with reference to FIGS. 1A and 1B. In an embodiment, the first ferroelectric layer 125 may include hafnium oxide, zirconium oxide, hafnium zirconium oxide, or a combination of two or more thereof. In an embodiment, the first ferroelectric layer 125 may include a dopant. The dopant may function to adjust the magnitude of the coercive electric field of a ferroelectric layer in the hysteresis graph of FIG. 1A. For example, the first ferroelectric layer 125 may include silicon (Si), zirconium (Zr), yttrium (Y), aluminum (Al), gadolinium (Gd), strontium (Sr), lanthanum (La), or a combination of two or more thereof. In an embodiment, the first ferroelectric layer 125 may have a thickness of about 5 nm to about 15 nm. In this case, the first ferroelectric layer 125 may have an orthorhombic crystal structure.

The ferroelectric induction layer 130 and the second ferroelectric layer 145 may be sequentially disposed on the first ferroelectric layer 125. The ferroelectric induction layer 130 may have a non-ferroelectric property. As an example, the ferroelectric induction layer 130 may have a paraelectric property. The ferroelectric induction layer 130 may have a crystalline phase. In addition, the ferroelectric induction layer 130 may include an insulator. In an embodiment, the ferroelectric induction layer 130 may include an insulative metal oxide. In an embodiment, when the first ferroelectric layer 125 includes hafnium oxide, zirconium oxide, hafnium zirconium oxide, or a combination of two or more thereof, the ferroelectric induction layer 130 may include magnesium oxide.

In an embodiment, the ferroelectric induction layer 130 may have a thickness of about 1 nm to about 5 nm. The ferroelectric induction layer 130 may function as a capacitor layer connected to the first and second ferroelectric layers 125 and 145 in series between the substrate 101 and the gate electrode layer 150. As the thickness of the ferroelectric induction layer 130 increases, the total capacitance of the electrical circuit between the substrate 101 and the gate electrode layer 150 can decrease. Accordingly, in order to prevent excessive degradation of the total capacitance, the thickness of the ferroelectric induction layer 130 is maintained at 1 nm to 5 nm.

The second ferroelectric layer 145 may have substantially the same ferroelectric property as the ferroelectric layer 1002 described above with reference to FIGS. 1A and 1B. In an embodiment, the second ferroelectric layer 145 may include hafnium oxide, zirconium oxide, hafnium zirconium oxide, or a combination of two or more thereof. In an embodiment, the second ferroelectric layer 145 may include a dopant. The dopant may function to adjust the magnitude of a coercive electric field of a ferroelectric layer, in the hysteresis graph of FIG. 1A. As an example, the second ferroelectric layer 145 may include silicon (Si), zirconium (Zr), yttrium (Y), aluminum (Al), gadolinium (Gd), strontium (Sr), lanthanum (La), or a combination of two or more thereof, as the dopant. In an embodiment, the second ferroelectric layer 145 may have a thickness of about 5 nm to about 15 nm. In this case, the second ferroelectric layer 145 may have an orthorhombic crystal structure.

In an embodiment, the first and second ferroelectric layers 125 and 145 may be formed of the same material. As an example, the first and second ferroelectric layers 125 and 145 may each be a hafnium oxide layer, zirconium oxide layer, or a hafnium zirconium oxide layer. In another embodiment, the first and second ferroelectric layers 125 and 145 may be formed of different materials. As an example, when the first ferroelectric layer 125 is a hafnium oxide layer, the second ferroelectric layer 145 may be a zirconium oxide layer. As another example, when the first ferroelectric layer 125 is a zirconium oxide layer, the second ferroelectric layer 145 may be a hafnium oxide layer.

Meanwhile, the ferroelectric induction layer 130 may have a lattice constant different from the lattice constants of the first and second ferroelectric layers 125 and 145. As described below with reference to FIGS. 3 to 5, when a crystallization process transforms first and second ferroelectric amorphous material layers 120 and 140 into the first and second ferroelectric layers 125 and 145, stress is induced at the respective interfaces of the ferroelectric induction layer 130 and the first and second ferroelectric layers 125 and 145 and applied to the interior of the first and second ferroelectric layers 125 and 145. The stress is due to the lattice constant difference between the ferroelectric induction layer 130 and the first and second ferroelectric layers 125 and 145. The stress may generate a lattice strain in the first and second ferroelectric layers 125 and 145 during the crystallization process. The lattice strain may form an electric field due to a flexoelectric effect in the first and second ferroelectric layers 125 and 145. The electric field may induce each of the first and second ferroelectric layers 125 and 145 to be crystallized to have a crystal structure of a tetragonal system having a ferroelectric property. As a result, the crystallized first and second ferroelectric layers 125 and 145 can assist in stably securing a ferroelectric property in both layers.

The gate electrode layer 150 may be disposed on the second ferroelectric layer 145. The gate electrode layer 150 may include a conductor. In an embodiment, the gate electrode layer 150 may have a lattice constant different from that of the second ferroelectric layer 145. The gate electrode layer 150 may function as a ferroelectric induction layer with respect to the second ferroelectric layer 145. In other words, in the above-described crystallization process for the first and second ferroelectric amorphous material layers 120 and 140, the gate electrode layer 150 may apply stress to the second ferroelectric layer 145. The stress may form a lattice strain in the crystallized second ferroelectric layer 145. The lattice strain may form an electric field due to a flexoelectric effect in the second ferroelectric layer 145, and the electric field may induce the second ferroelectric layer 145 to have a tetragonal crystal structure having ferroelectric property.

In some other embodiments, the gate electrode layer 150 may not function as a ferroelectric induction layer with respect to the second ferroelectric layer 145. In this case, the second ferroelectric layer 145 may be induced to have a tetragonal crystal structure only by the ferroelectric induction layer 130 positioned thereunder.

The gate electrode layer 150 may include, for example, tungsten (W), titanium (Ti), tantalum (Ta), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. When the gate electrode 150 functions as a ferroelectric induction layer with respect to the second ferroelectric layer 145, the gate electrode layer 150 may include titanium nitride.

In an embodiment not illustrated, an interfacial insulation layer may be further disposed between the channel layer 102 and the first ferroelectric layer 125. The interfacial insulation layer can prevent direct contact between the channel layer 102 and the first ferroelectric layer 125 to reduce the concentration of defect sites that may occur at an interface between the channel layer 102 and the first ferroelectric layer 125. The interfacial insulation layer may include, for example, silicon oxide or aluminum oxide. The interfacial insulation layer may have an amorphous phase.

As described above, a ferroelectric memory device according to an embodiment of the present disclosure may include a first ferroelectric layer, a ferroelectric induction layer and a second ferroelectric layer that are sequentially disposed between a substrate and a gate electrode layer. The first ferroelectric layer, the ferroelectric induction layer and the second ferroelectric layer may constitute a gate dielectric layer structure of the ferroelectric memory device. In this case, the first and second ferroelectric layers may operate as memory functional layers that store remanent polarization.

A ferroelectric induction layer having a paraelectric property may be interposed between the first and second ferroelectric layers to help the first and second ferroelectric layers to stably secure the ferroelectric properties. That is, the ferroelectric induction layer may be used to substantially increase a thickness of a gate dielectric layer having ferroelectric property in the ferroelectric memory device. Accordingly, the memory window of the ferroelectric memory device can be effectively increased.

Figure 3:
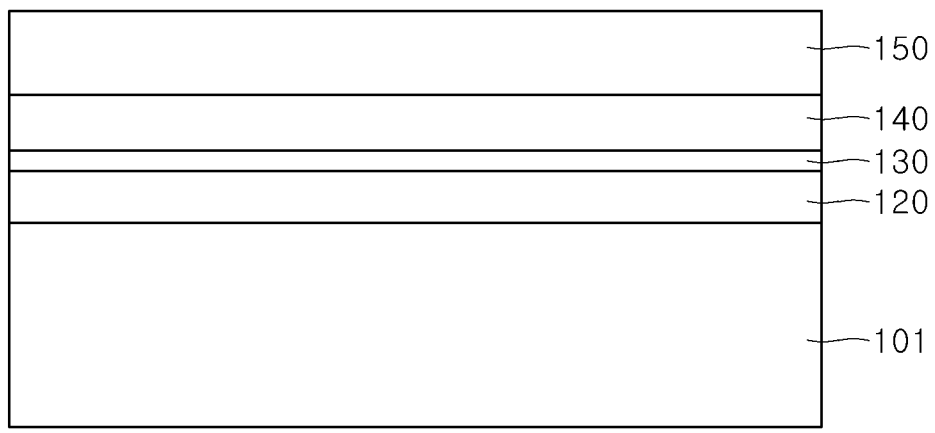
FIGS. 3 to 5 are cross-sectional views schematically illustrating a method of manufacturing a ferroelectric memory device according to an embodiment of the present disclosure.
Figure 5:
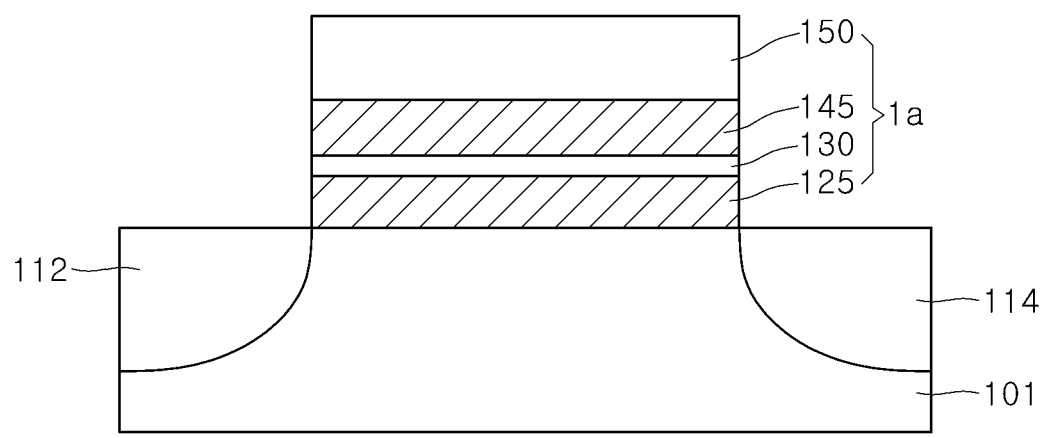

FIGS. 3 and 5 are cross-sectional views schematically illustrating a method of manufacturing a ferroelectric memory device according to an embodiment of the present disclosure. In an embodiment, the method described herein may be used to manufacture the ferroelectric memory device 1 described above with reference to FIG. 2.

Referring to FIG. 3, a substrate 101 may be provided. The substrate 101 may be a silicon (Si) substrate, a gallium arsenide (GaAs) substrate, an indium phosphide (InP) substrate, a germanium (Ge) substrate, or a silicon germanium (SiGe) substrate, for example. In an embodiment, the substrate 101 may be doped to have conductivity. As an example, the substrate 101 may be doped with an n-type or p-type dopant. As another example, the substrate 101 may include a well region doped with an n-type or p-type dopant therein.

A first ferroelectric amorphous material layer 120, a ferroelectric induction layer 130, a second ferroelectric amorphous material layer 140, and a gate electrode layer 150 may be sequentially formed on the substrate 101.

The first ferroelectric amorphous material layer 120 may include, for example, hafnium oxide, zirconium oxide, hafnium zirconium oxide, or a combination of two or more thereof. The first ferroelectric amorphous material layer 120 may be formed in an amorphous state. The first ferroelectric amorphous material layer 120 may not have sufficient ferroelectric property to store remanent polarization in an amorphous state. The first ferroelectric amorphous material layer 120 may be formed by a chemical vapor deposition method, a sputtering method, or an atomic layer deposition method, for example. The first ferroelectric amorphous material layer 120 may have, for example, a thickness of about 5 nm to about 15 nm.

The ferroelectric induction layer 130 may be formed in a crystalline state. The ferroelectric induction layer 130 may include an insulator. The ferroelectric induction layer 130 may include, for example, magnesium oxide, however the ferroelectric induction layer 130 is not necessarily limited to having magnesium oxide. The ferroelectric induction layer 130 may include a material having a lattice constant different from those of crystalline hafnium oxide, crystalline zirconium oxide, or crystalline hafnium zirconium oxide. The ferroelectric induction layer 130 may be formed, for example, by a chemical vapor deposition method, a sputtering method, or an atomic layer deposition method. The ferroelectric induction layer 130 may have, for example, a thickness of about 1 nm to about 5 nm.

The second ferroelectric amorphous material layer 140 may include, for example, hafnium oxide, zirconium oxide, hafnium zirconium oxide, or a combination of two or more thereof. The second ferroelectric amorphous material layer 140 may be formed in an amorphous state. The second ferroelectric amorphous material layer 140 may not have a sufficient ferroelectric property to store remanent polarization in an amorphous state. The second ferroelectric amorphous material layer 140 may be formed, for example, by a chemical vapor deposition method, a sputtering method, or an atomic layer deposition method. The second ferroelectric amorphous material layer 140 may have, for example, a thickness of about 5 nm to about 15 nm.

In an embodiment, the first and second ferroelectric amorphous material layers 120 and 140 may be formed of the same material. As an example, each of the first and second ferroelectric amorphous material layers 120 and 140 may be a hafnium oxide layer, a zirconium oxide layer, or a hafnium zirconium oxide layer. In another embodiment, the first and second ferroelectric amorphous material layers 120 and 140 may be formed of different materials. As an example, when the first ferroelectric amorphous material layer 120 is a hafnium oxide layer, the second ferroelectric amorphous material layer 140 may be a zirconium oxide layer. As another example, when the first ferroelectric amorphous material layer 120 is a zirconium oxide layer, the second ferroelectric amorphous material layer 140 may be a hafnium oxide layer.

The gate electrode layer 150 may include a conductor. The gate electrode layer 150 may include, for example, tungsten (W), titanium (Ti), tantalum (Ta), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. In an embodiment, the gate electrode 150 may include a material having a lattice constant different from those of crystalline hafnium oxide, crystalline zirconium oxide, or crystalline hafnium zirconium oxide.

Figure 4:
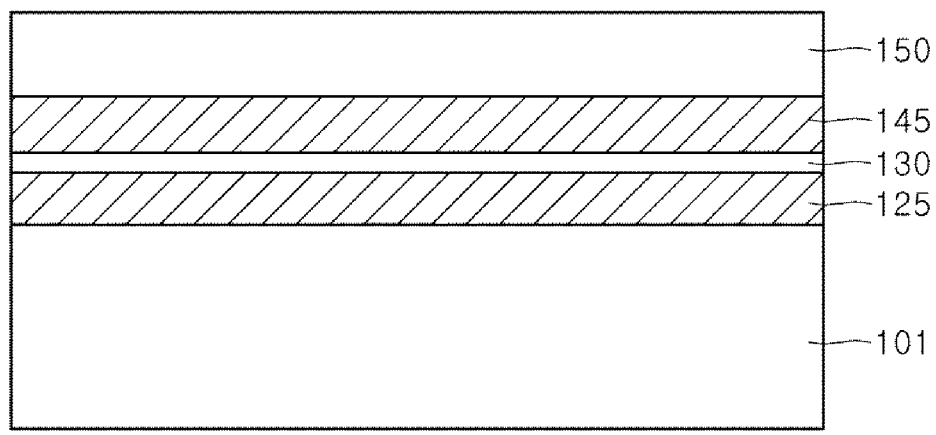

Referring to FIG. 4, crystallization heat treatment may be performed with respect to the first and second ferroelectric amorphous material layers 120 and 140. In an embodiment, the crystallization heat treatment may be performed at a process temperature of 500° C. to 1000° C. At this time, the first and second ferroelectric amorphous material layers 120 and 140 may be converted into first and second ferroelectric layers 125 and 145 having tetragonal crystal structure having ferroelectricity due to stress applied from the ferroelectric induction layer 130 during the crystallization process. In some embodiments, when the gate electrode layer 150 has a different lattice constant from the second ferroelectric layer 145, the gate electrode layer 150 may apply stress to the second ferroelectric amorphous layer 140 during the crystalline process.

Referring to FIG. 5, the first ferroelectric layer 125, the ferroelectric induction layer 130, the second ferroelectric layer 145, and the gate electrode layer 150 may be patterned to form a gate structure 1a. Then, regions of the substrate 101 positioned at both ends of the gate structure 1a may be doped with a dopant to form a source region 112 and a drain region 114. Through the above-described process, it is possible to manufacture a ferroelectric memory device according to an embodiment of the present disclosure.

Figure 6:
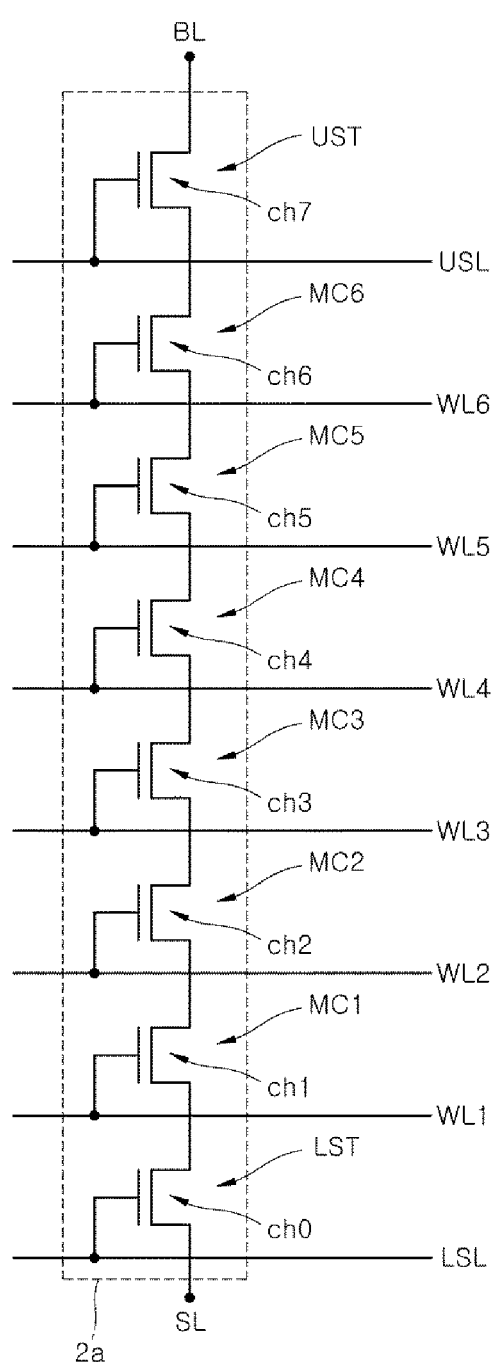
FIG. 6 is a circuit diagram schematically illustrating a ferroelectric memory device according to an embodiment of the present disclosure.

FIG. 6 is a circuit diagram schematically illustrating a ferroelectric memory device 2 according to an embodiment of the present disclosure. The technical idea of the present disclosure may be used in a NAND type device corresponding to the circuit diagram of FIG. 6.

Referring to FIG. 6, the ferroelectric memory device 2 may include a string 2a having an array of a plurality of transistors whose channels are connected in series. An end of the string 2a may be connected to a source line SL and the other end of the string 2a may be connected to a bit line BL. The string 2a may have first to sixth memory cell transistors MC1, MC2, MC3, MC4, MC5 and MC6 connected to each other in series. In addition, the string 2a may include a lower selection transistor LST disposed between the first memory cell transistor MC1 and the source line SL, and an upper selection transistor UST disposed between the sixth memory cell transistor MC6 and the bit line BL. In FIG. 6, for convenience of description, the string 2a is illustrated to have six memory cell transistors, but the present disclosure is not necessarily limited thereto. The number of the memory cell transistors constituting the string 2a is not limited. In addition, in FIG. 6, the string 2a is illustrated to have one lower selection transistor LST and one upper selection transistor UST, but the present disclosure is not necessarily limited thereto. The lower selection transistor LST may include a plurality of lower selection transistors whose channels are connected in series to each other. Likewise, the upper selection transistor UST may include a plurality of upper selection transistors whose channels are connected in series to each other.

The first to sixth memory cell transistors MC1, MC2, MC3, MC4, MC5 and MC6 may have first to sixth channel layers ch1, ch2, ch3, ch4, ch5 and ch6 respectively between the source line SL and the bit line BL. The first to sixth memory cell transistors MC1, MC2, MC3, MC4, MC5 and MC6 may have ferroelectric gate dielectric layers adjacent to the first to sixth channel layers ch1, ch2, ch3, ch4, ch5 and ch6, respectively. Gate electrode layers of the first to sixth memory cell transistors MC1, MC2, MC3, MC4, MC5 and MC6 may each be connected to different first to sixth word lines WL1, WL2, WL3, WL4, WL5 and WL6. Each of the upper selection transistor UST and the lower selection transistor LST may be turned on or turned off, respectively, to apply a voltage between the bit line BL and the source line SL to the first to sixth channel layers ch1, ch2, ch3, ch4, ch5 and ch6, or to remove the applied voltage from the first to sixth channel layers ch1, ch2, ch3, ch4, ch5 and ch6. The gate electrode layers of the upper selection transistor UST and lower selection transistor LST may be connected to an upper selection line USL and a lower selection line LSL, respectively.

In an embodiment, a write operation on at least one of the first to sixth memory cell transistors MC1, MC2, MC3, MC4, MC5 and MC6 may be performed as follows. When the upper selection transistor UST and the lower selection transistor LST are turned on, a predetermined write voltage may be applied to gate electrodes of corresponding memory cell transistors MC1, MC2, MC3, MC4, MC5 and MC6 through the respective first to sixth word lines WL1, WL2, WL3, WL4, WL5 and WL6. In the ferroelectric gate dielectric layers of the memory cell transistors MC1, MC2, MC3, MC4, MC5 and MC6 to which the write voltage is applied, predetermined electrical polarization may be recorded in a nonvolatile manner. The electrical signals recorded in the ferroelectric gate dielectric layers may vary depending on the polarization orientation and the magnitude of the polarization. Accordingly, the first to sixth the memory cell transistors MC1, MC2, MC3, MC4, MC5 and MC6 can perform an operation related to nonvolatile memory.

Likewise, a read operation on the string 2a including the first to sixth the memory cell transistors MC1, MC2, MC3, MC4, MC5 and MC6 may be performed as follows. When the upper selection transistor UST and the lower selection transistor LST are turned on, a predetermined read voltage may be applied to the gate electrodes of the corresponding memory cell transistors MC1, MC2, MC3, MC4, MC5 and MC6 through the respective first to sixth word lines WL1, WL2, WL3, WL4, WL5 and WL6.

At this time, the polarization recorded in the ferroelectric gate dielectric layer of each of the memory cell transistors MC1, MC2, MC3, MC4, MC5 and MC6 can control the magnitude of a current flowing through the channel of the corresponding memory cell transistors MC1, MC2, MC3, MC4, MC5 and MC6. As a result, the polarization recorded in the ferroelectric gate dielectric layer of each of the memory cell transistors MC1, MC2, MC3, MC4, MC5 and MC6 can determine the electrical resistance of the string 2a through the resistances in first to sixth channel layers ch1, ch2, ch3, ch4, ch5 and ch6. By determining the difference in the electrical resistances, it is possible to determine the electrical signal stored in the string 2a.

Figure 7A:
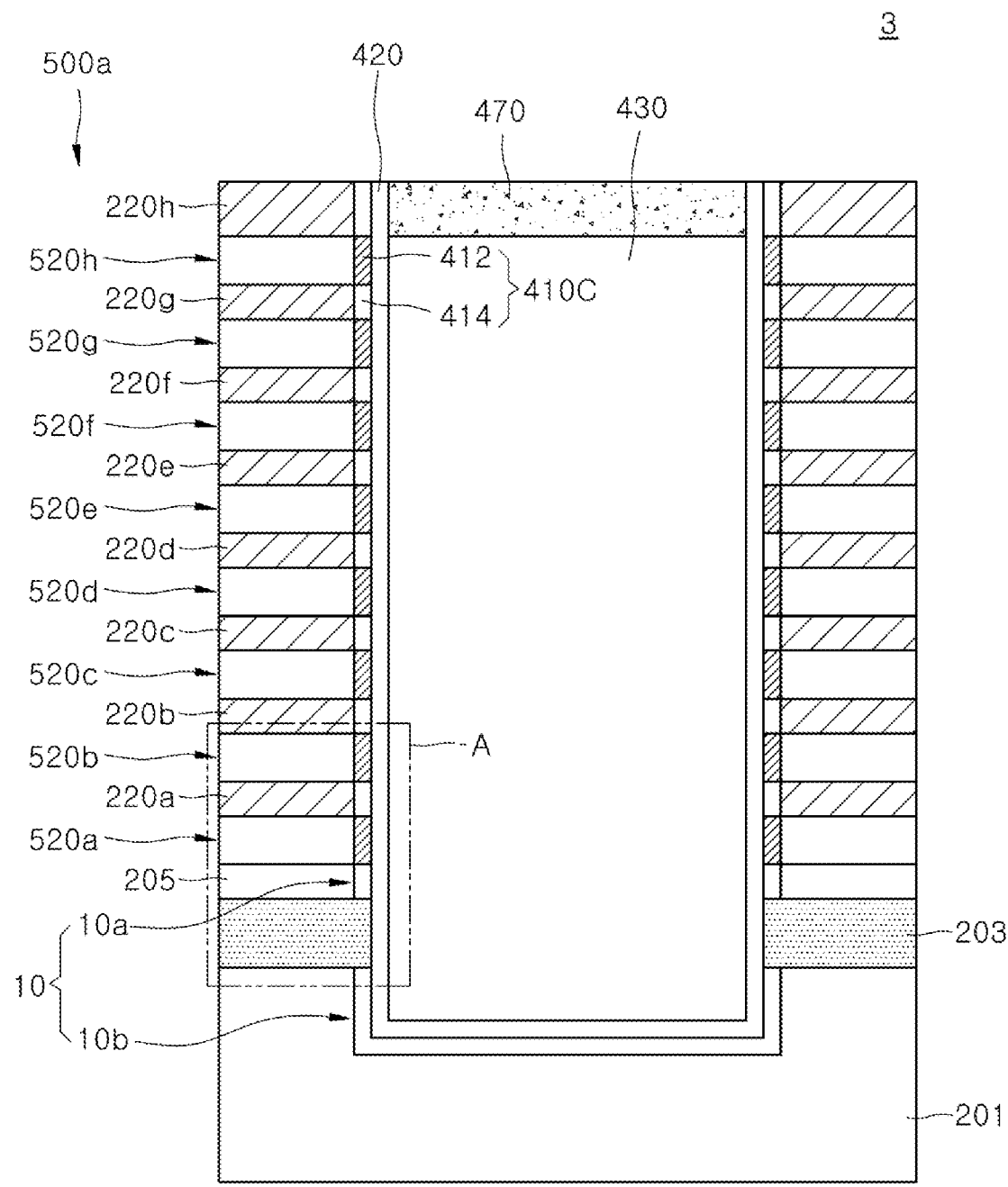
FIG. 7A is a cross-sectional view schematically illustrating a ferroelectric memory device according to an embodiment of the present disclosure.
Figure 7B:
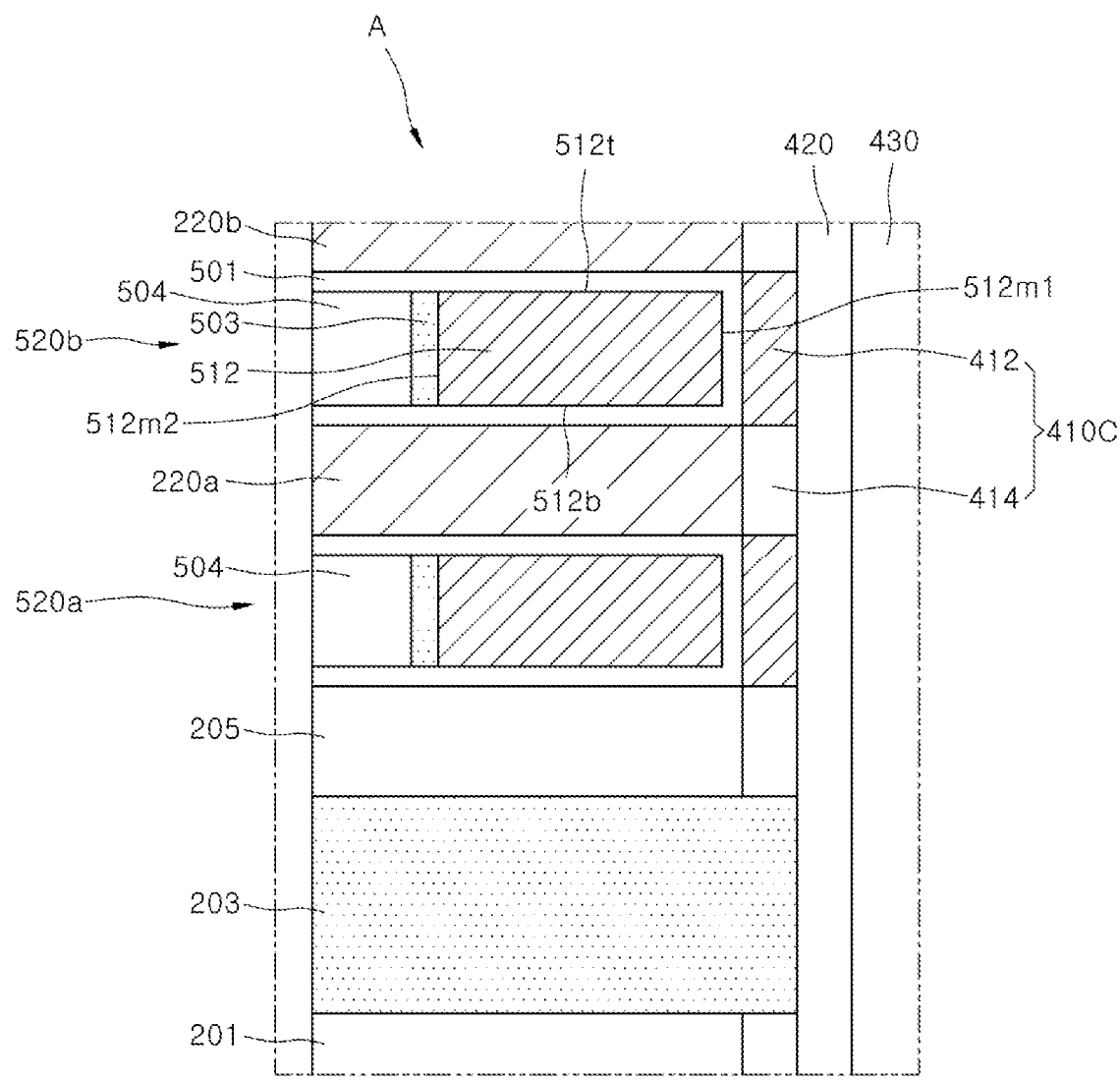
FIG. 7B is an enlarged view of the region 'A' of FIG. 7A.

FIG. 7A is a cross-sectional view schematically illustrating a ferroelectric memory device 3 according to an embodiment of the present disclosure. FIG. 7B is an enlarged view of the region 'A' of FIG. 7A. The ferroelectric memory device 3 of FIGS. 7A and 7B may be an exemplary implementation of the ferroelectric memory device 2 having a circuit diagram of FIG. 6.

Referring to FIG. 7A, the ferroelectric memory device 3 may include a substrate 201, and a gate stack 500a on the substrate 201. The substrate 201 may be substantially the same as the substrate 101 of the ferroelectric memory device 1 described above with reference to FIG. 2. The gate stack 500a may include first to eighth gate structures 520a, 520b, 520c, 520d, 520e, 520f, 520g and 520h and first to eighth interlayer insulation layers 220a, 220b, 220c, 220d, 220e, 220f, 220g and 220h, which are alternately stacked in a direction perpendicular to the substrate 201. In an embodiment, the eighth interlayer insulation layer 220h may be formed to be thicker than the first to seventh interlayer insulation layers 220a, 220b, 220c, 220d, 220e, 220f and 220g. In an embodiment, the first to seventh interlayer insulation layers 220a, 220b, 220c, 220d, 220e, 220f and 220g may be formed to have the same thickness. Likewise, the first to eighth gate structures 520a, 520b, 520c, 520d, 520e, 520f, 520g and 520h may be formed to have the same thickness.

The first to eighth gate structures 520a, 520b, 520c, 520d, 520e, 520f, 520g and 520h may be electrically connected to the lower selection line (not shown), the word line (not shown), and the upper selection line (not shown) of the ferroelectric memory device 2 described above with reference to FIG. 6. The first to eighth gate structures 520a, 520b, 520c, 520d, 520e, 520f, 520g and 520h are briefly illustrated in FIG. 7A for convenience of illustration and will be described in detail with reference to FIG. 7B below.

The ferroelectric memory device 3 may include a trench 10 having a first portion 10a and a second portion 10b. The first portion 10a of the trench 10 may be formed on the substrate 201 to penetrate the gate stack 500a, and the second portion 10b may have a shape discontinuously extending below the first portion 10a and may be formed or defined in the substrate 201. The first portion 10a of the trench 10 may expose side surfaces of the first to eighth gate structures 520a, 520b, 520c, 520d, 520e, 520f, 520g and 520h and side surfaces of the first to eighth interlayer insulation layers 220a, 220b, 220c, 220d, 220e, 220f, 220g and 220h.

In addition, the ferroelectric memory device 3 may include a source contact layer 203 disposed between the substrate 201 and the gate stack 500a. The source contact layer 203 may separate the first portion 10a and the second portion 10b of the trench 10 in a direction perpendicular to the substrate 201, that is, the z-direction. A source insulation layer 205 may be disposed between the source contact layer 203 and the first gate structure 520a. The source insulation layer 205 may electrically insulate the source contact layer 203 and the first gate structure 520a. The source insulation layer 205 may include insulative oxide, insulative nitride, insulative oxynitride, etc., for example.

The ferroelectric memory device 3 may include a first gate dielectric layer 410C disposed along an inner surface of the trench 10. The first gate dielectric layer 410C may extend in a direction perpendicular to the substrate 201, that is, the z-direction. Specifically, the first gate dielectric layer 410C may be disposed to cover the first to eighth gate structures 520a, 520b, 520c, 520d, 520e, 520f, 520g and 520h and the first to eighth interlayer insulation layers 220a, 220b, 220c, 220d, 220e, 220f, 220g and 220h along an inner surface of the first portion 10a of the trench 10. In addition, the first gate dielectric layer 410C may be disposed to cover the substrate 201 along an inner surface of the second portion 10b of the trench 10. That is, the first gate dielectric layer 410C may cover portions of the substrate 201 along a sidewall and a bottom of the trench 10 under the source contact layer 203.

Referring to FIG. 7A, the first gate dielectric layer 410C may include ferroelectric portions 412 and non-ferroelectric portions 414. The ferroelectric portions 412 may be disposed to contact the first to eighth gate structures 520a, 520b, 520c, 520d, 520e, 520f, 520g and 520h. The non-ferroelectric portions 414 may be disposed to contact the first to eighth interlayer insulation layers 220a, 220b, 220c, 220d, 220e, 220f, 220g and 220h.

The ferroelectric portions 412 and the non-ferroelectric portions 414 may be formed of the same material, but may have different crystal structures. As an example, each of the ferroelectric portions 412 may have a crystal structure with a ferroelectric property, while each of the non-ferroelectric portions 414 may have a crystal structure with a paraelectric property. As an example, the ferroelectric portions 412 may each have a crystal structure of an orthorhombic system, and the non-ferroelectric portions 414 may each have a crystal structure of a tetragonal system or a monoclinic system. Each of the ferroelectric portions 412 and each of the non-ferroelectric portions 414 may have a thickness of about 5 nm to about 15 nm in the lateral direction (i.e., x-direction).

The first gate dielectric layer 410C may include hafnium oxide, zirconium oxide, hafnium zirconium oxide, or a combination of two or more thereof, for example. The first gate dielectric layer 410C may include a dopant. The dopant may include silicon (Si), zirconium (Zr), yttrium (Y), aluminum (Al), gadolinium (Ga), strontium (Sr), lanthanum (La), or a combination of two or more thereof, for example.

Referring to FIG. 7A, a channel layer 420 may be disposed on the first gate dielectric layer 410C and the source contact layer 203. The channel layer 420 may be disposed to cover the first gate dielectric layer 410C. In addition, the channel layer 420 may be disposed to contact side surfaces of the source contact layer 203. Accordingly, the channel layer 420 can be electrically connected to the source contact layer 203. The channel layer 420 may include a semiconductor material, for example. The semiconductor material may include silicon (Si), germanium (Ge), silicon germanium (SiGe), gallium arsenide (GaAs), indium gallium arsenide (InGaAs), or a combination of two or more thereof. In an embodiment, the semiconductor material may be doped into n-type or p-type. The channel layer 420 may include conductive metal oxide, as another example. The conductive metal oxide may include indium gallium zinc oxide (IGZO), or indium tin oxide (ITO), etc., for example.

Referring to FIG. 7A, a filling material layer 430 may be disposed to fill the trench 10, in open areas between the channel layers 420 common to first to seventh gate structures 520a, 520b, 520c, 520d, 520e, 520f, and 520g. As an example, the filling material layer 430 may include oxide, nitride, or oxynitride.

A channel contact layer 470 may be disposed on the filling material layer 430 common to eighth interlayer insulation layer 220h. The channel contact layer 470 may be electrically connected to a bit line (not shown) so that an end of the channel layer 420 can be electrically connected to the bit line. Meanwhile, as described above, the other end of the channel layer 420 may be connected to the source contact layer 203, and may be electrically connected to a source line (not shown) through the source contact layer 203.

Hereinafter, the first to eighth gate structures 520a, 520b, 520c, 520d, 520e, 520f, 520g and 520h will be described with reference to FIG. 7B. Each of the first to eighth gate structures 520a, 520b, 520c, 520d, 520e, 520f, 520g and 520h may include a ferroelectric induction layer 501, a ferroelectric second gate dielectric layer 512 and a gate electrode layer 503. In addition, each of the first to eighth gate structures 520a, 520b, 520c, 520d, 520e, 520f, 520g and 520h may further include a conductive layer 504 in contact with the gate electrode layer 503.

The ferroelectric induction layer 501 may be disposed to contact the first to eighth interlayer insulation layers 220a, 220b, 220c, 220d, 220e, 220f, 220g and 220h and the ferroelectric portion 412 of the first gate dielectric layer 410C. The ferroelectric induction layer 501 may have a non-ferroelectric property. As an example, the ferroelectric induction layer 501 may have a paraelectric property. The ferroelectric induction layer 501 may have a crystalline phase. In addition, the ferroelectric induction layer 501 may include an insulator. In an embodiment, the ferroelectric induction layer 501 may include metal oxide. As an example, the ferroelectric induction layer 501 may include magnesium oxide.

In an embodiment, the ferroelectric induction layer 501 may have a thickness of about 1 nm to about 5 nm. Between the channel layer 420 and the gate electrode layer 503, the ferroelectric induction layer 501 may function as a capacitor layer connected in series to the first gate dielectric layer 410C and the ferroelectric second gate dielectric layer 512. As the thickness of the ferroelectric induction layer 501 increases, the total capacitance of the electrical circuit between the channel layer 420 and the gate electrode layer 503 may decrease. Accordingly, the thickness of the ferroelectric induction layer 501 may be maintained at one nanometer (1 nm) to five nanometers (5 nm) in order to prevent excessive degradation of the total capacitance.

The ferroelectric second gate dielectric layer 512 may be disposed on the ferroelectric induction layer 501. Specifically, the second gate dielectric layer 512 may contact the ferroelectric induction layer 501. As an example, a top surface 512t, a bottom surface 512b and one side surface 512m1 of the second gate dielectric layer 512 may contact the ferroelectric induction layer 501.

The second gate dielectric layer 512 may have a crystalline phase having a ferroelectric property. As an example, the second gate dielectric layer 512 may have a crystal structure of an orthorhombic system. The second gate dielectric layer 512 may have a thickness of about 5 nm to about 15 nm in a direction perpendicular to a contact surface 512t or 512b common to the ferroelectric induction layer 501. The second gate dielectric layer 512 may include hafnium oxide, zirconium oxide, hafnium zirconium oxide or a combination of two or more thereof, for example. The second gate dielectric layer 512 may include a dopant. The dopant may include silicon (Si), zirconium (Zr), yttrium (Y), aluminum (Al), gadolinium (Ga), strontium (Sr), lanthanum (La), or a combination of two or more thereof, for example.

In an embodiment, the first gate dielectric layer 410C and the second gate dielectric layer 512 may be formed of the same material. In another embodiment, the first gate dielectric layer 410C and the second gate dielectric layer 512 may be formed of different materials. As an example, when the first gate dielectric layer 410C is a hafnium oxide layer, the second gate dielectric layer 512 may be a zirconium oxide layer. As another example, when the first gate dielectric layer 410C is a zirconium oxide layer, the second gate dielectric layer 512 may be a hafnium oxide layer.

In an embodiment, the ferroelectric induction layer 501 may have a lattice constant different from those of the first gate dielectric layer 410C and second gate dielectric layer 512. The lattice constant difference between the ferroelectric induction layer 501 and the first gate dielectric layer 410C and the lattice constant difference between the ferroelectric induction layer 501 and the second gate dielectric layer 512 may result in applied stress from the interfaces with the ferroelectric induction layer 501 into the first and second gate dielectric layers 410C and 512, during a crystallization process to be described with reference to FIGS. 13A and 13B for crystallizing the first and second ferroelectric amorphous material layers 410 and 502 into the first and second gate dielectric layers 410C and 512. The stress may cause a lattice strain inside the first and second gate dielectric layers 410C and 512 when the first and second ferroelectric amorphous material layers 410 and 502 are crystallized into the first and second gate dielectric layers 410C and 512. The lattice strain may form an electric field due to a flexoelectric effect inside the first and second gate dielectric layers 410C and 512. The electric field may induce the first and second gate dielectric layers 410C and 512 to have tetragonal crystal structures having ferroelectric properties. As a result, the first and second gate dielectric layers 410C and 512 have more stable ferroelectric properties.

The gate electrode layer 503 may be disposed on a side surface 512m2 of the second gate dielectric layer 512. The gate electrode layer 503 may contact the second gate dielectric layer 512. The gate electrode layer 503 may include a conductor. In an embodiment, the gate electrode layer 503 may have a lattice constant different from that of the second gate dielectric layer 512. The gate electrode layer 503 may function as a ferroelectric induction layer with respect to the second gate dielectric layer 512. That is, in the above-described crystallization process for the first and second ferroelectric amorphous material layers 410 and 502, in the same process, the gate electrode layer 503 may apply stress to the second ferroelectric amorphous material layer 502. The stress may cause a lattice strain inside the second gate dielectric layer 512 when the second ferroelectric amorphous material layer 502 is crystallized to the second gate dielectric layer 512. The lattice strain may form an electric field due to a flexoelectric effect inside the second gate dielectric layer 512, and the electric field may induce the second gate dielectric layer 512 to have a tetragonal crystal structure having a ferroelectric property. The gate electrode layer 503 may have a thickness of about 5 nm to about 15 nm in the vertical direction, for example. In some other embodiments, the gate electrode layer 503 may not function as a ferroelectric induction layer with respect to the second gate dielectric layer 512. In such embodiments, the second gate dielectric layer 512 may be induced to have a tetragonal crystal structure only by the ferroelectric induction layer 501.

The gate electrode layer 503 may include tungsten (W), titanium (Ti), tantalum (Ta), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. When the gate electrode layer 503 functions as a ferroelectric induction layer with respect to the second gate dielectric layer 512, the gate electrode layer 503 may, for example, include titanium nitride.

Referring to FIG. 7B, a conductive layer 504 may be disposed on the gate electrode layer 503. The conductive layer 504 may include a conductive material having a lower resistivity than the gate electrode layer 503. The conductive layer 504 may be disposed to contact the gate electrode layer 503 and the ferroelectric induction layer 501. In some other embodiments, the conductive layer 504 may be omitted by increasing a thickness of the gate electrode layer 503 in the lateral direction (i.e., the x-direction).

As described above, a ferroelectric memory device according to an embodiment of the present disclosure may have a ferroelectric first gate dielectric layer, a ferroelectric induction layer and a ferroelectric second gate dielectric layer that are sequentially disposed between a channel layer and a gate electrode layer. The first gate dielectric layer, the ferroelectric induction layer and the second gate dielectric layer may constitute a gate dielectric layer structure of the ferroelectric memory device. The first and second gate dielectric layers may operate as memory functional layers that store remanent polarization.

Meanwhile, the ferroelectric induction layer having a non-ferroelectric property may be interposed between the first and second gate dielectric layers to stabilize the ferroelectric property of the first and second gate dielectric layers. In other words, the ferroelectric induction layer can be used to substantially increase the thickness of the ferroelectric gate dielectric layer in the ferroelectric memory device. Accordingly, the memory window of the ferroelectric memory device can be effectively increased.

FIGS. 8 to 11, FIGS. 12A to 16A, and FIGS. 12B to 16B are cross-sectional views schematically illustrating a method of manufacturing a ferroelectric memory device according to an embodiment of the present disclosure. FIGS. 12B to 16B are enlarged views of the regions 'A' of FIGS. 12A to 16A, respectively. FIGS. 12B to 16B illustrate all the components not shown for convenience in FIGS. 12A to 16A, respectively.

Figure 8:
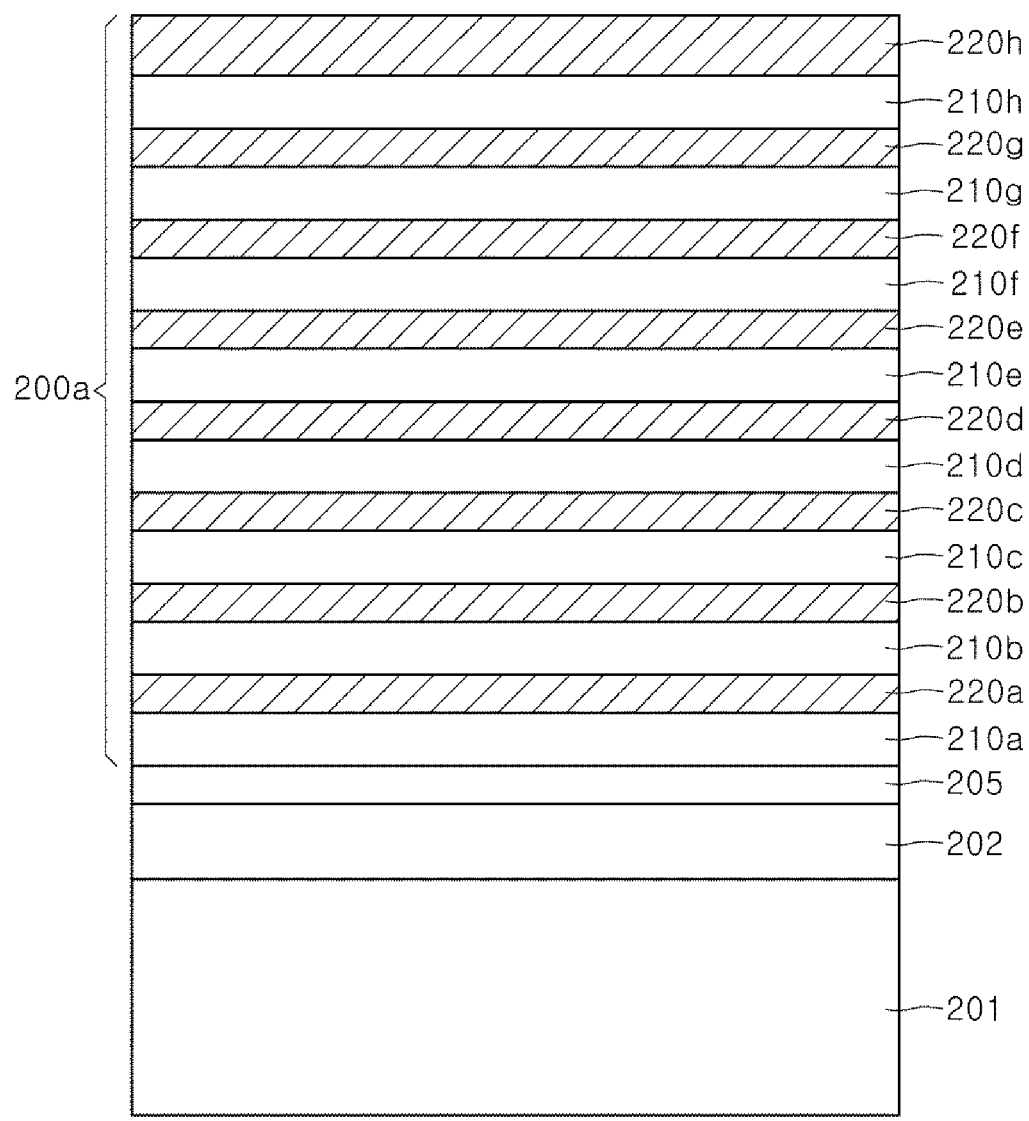

Referring to FIG. 8, a substrate 201 may be prepared. In an embodiment, the substrate 201 may be a semiconductor substrate. The substrate 201 may be a silicon (Si) substrate, a gallium arsenide (GaAs) substrate, an indium phosphide (InP) substrate, a germanium (Ge) substrate, or a silicon germanium (SiGe) substrate, for example. In an embodiment, the substrate 201 may be doped to have conductivity. As an example, the substrate 201 may be doped with an n-type or p-type dopant. As another example, the substrate 201 may include a well region doped with an n-type or p-type dopant therein.

Then, a sacrificial layer 202 and a source insulation layer 205 may be formed on the substrate 201. The sacrificial layer 202 may include a material having etching selectivity with respect to the substrate 201 and the source insulation layer 205. The sacrificial layer 202 may be removed in a process with reference to FIGS. 15A, 15B, 16A and 16B to be described later, and a source contact layer 203 may be formed in a space where the sacrificial layer 202 has been removed. That is, the sacrificial layer 202 may provide a space in which the source contact layer 203 is to be formed. The sacrificial layer 202 may include, for example, oxide, nitride or oxynitride. The source insulation layer 205 may include, for example, oxide, nitride or oxynitride. The sacrificial layer 202 and the source insulation layer 205 may each be formed by using a chemical vapor deposition method or an atomic layer deposition method, for example.

Next, a stack structure 200a may be formed on the source insulation layer 205. The stack structure 200a may include interlayer sacrificial layers 210a, 210b, 210c, 210d, 210e, 210f, 210g and 210h and interlayer insulation layers 220a, 220b, 220c, 220d, 220e, 220f, 220g and 220h, which are alternately stacked with each other. As illustrated, a lowermost interlayer sacrificial layer 210a may contact the source insulation layer 205. An uppermost interlayer insulation layer 220h may have a thickness greater than those of the remaining interlayer insulation layers 220a, 220b, 220c, 220d, 220e, 220f and 220g. The interlayer sacrificial layers 210a, 210b, 210c, 210d, 210e, 210f, 210g and 210h and the interlayer insulation layers 220a, 220b, 220c, 220d, 220e, 220f, 220g and 220h may be formed by using a chemical vapor deposition method or an atomic layer deposition method, for example.

Figure 9:
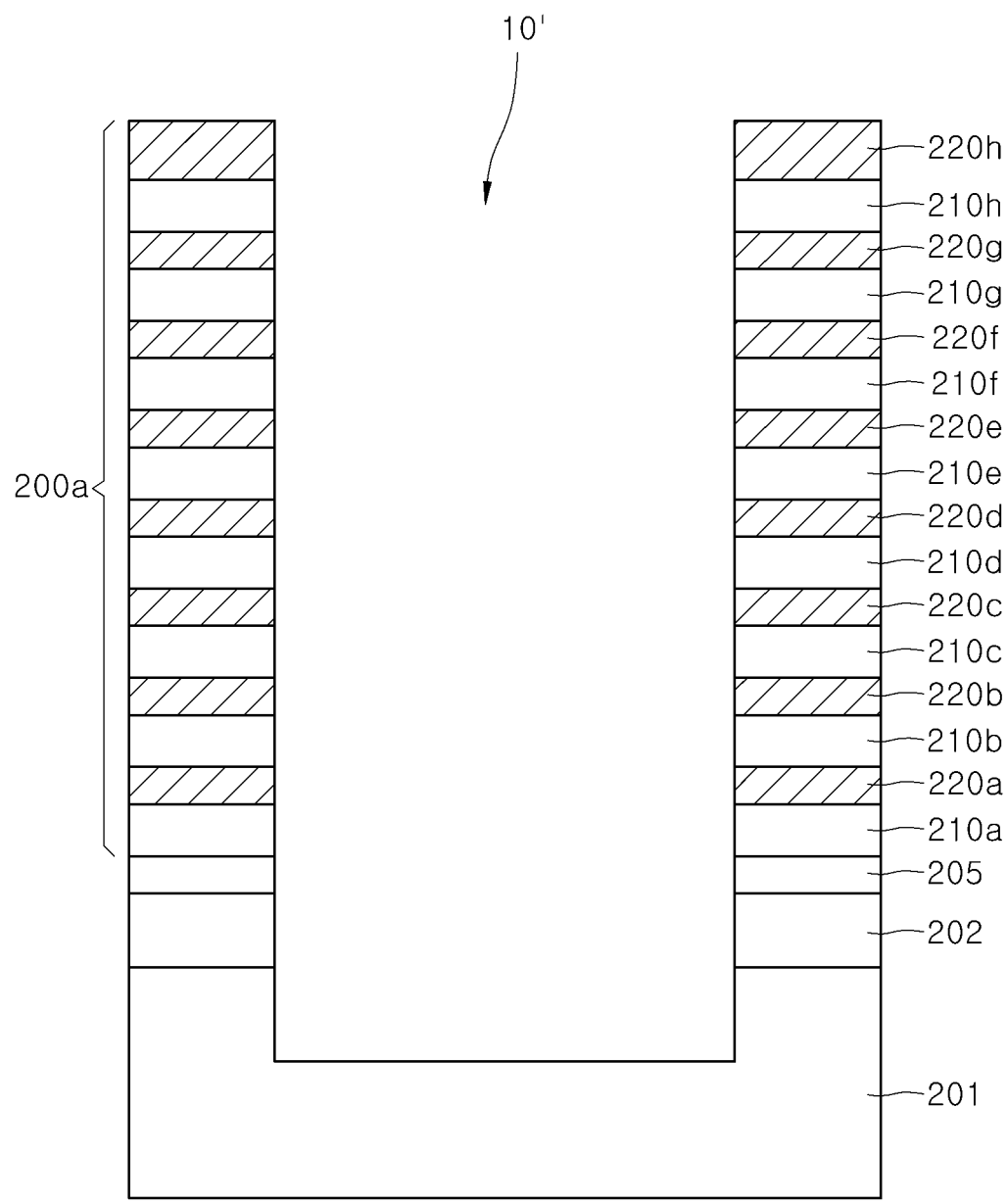

Referring to FIG. 9, a trench 10' may be formed to penetrate the stack structure 200a, the source insulation layer 205 and the sacrificial layer 202 on the substrate 201. The trench 10' may expose the substrate 201. As a result of etching, side surfaces of the stack structure 200a, the source insulation layer 205 and the sacrificial layer 202 may be exposed to a side surface of the trench 10'. The trench 10' may be formed by an anisotropic etching method, for example.

Figure 10:
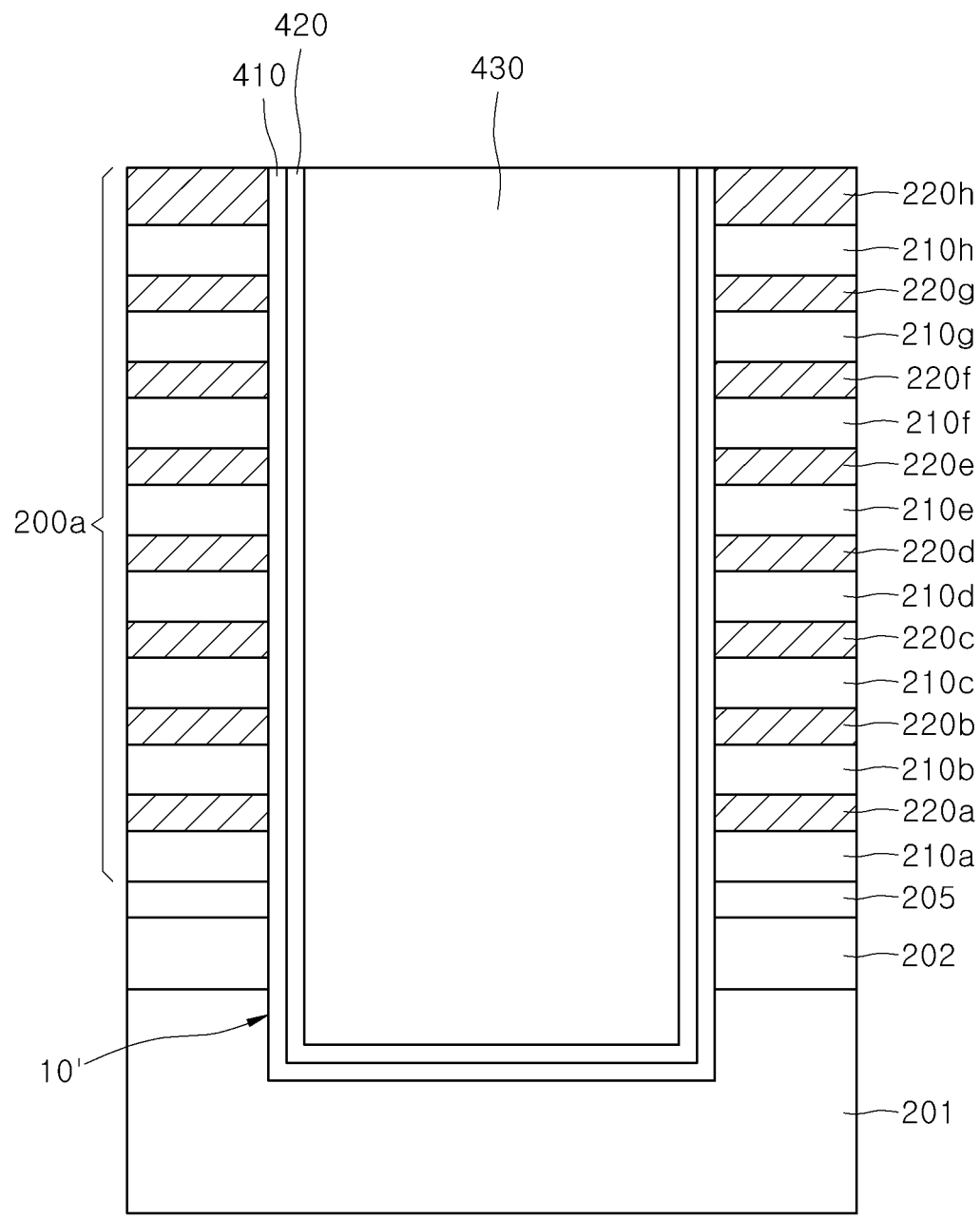

Referring to FIG. 10, a first ferroelectric amorphous material layer 410 may be formed on an inner surface of the trench 10'. The first ferroelectric amorphous material layer 410 may include, for example, hafnium oxide, zirconium oxide, hafnium zirconium oxide, or a combination of two or more thereof. The first ferroelectric amorphous material layer 410 may include a dopant. The dopant may include silicon (Si), zirconium (Zr), yttrium (Y), aluminum (Al), gadolinium (Ga), strontium (Sr), lanthanum (La), or a combination of two or more thereof, for example. The first ferroelectric amorphous material layer 410 may have a thickness of about 5 nm to about 15 nm, for example. The first ferroelectric amorphous material layer 410 may be formed by using a chemical vapor deposition method or an atomic layer deposition method, for example.

A channel layer 420 may be formed on the first ferroelectric amorphous material layer 410. The channel layer 420 may include, for example, a semiconductor material. The semiconductor material may include silicon (Si), germanium (Ge), silicon germanium (SiGe), gallium arsenide (GaAs), indium gallium arsenide (InGaAs), or a combination of two or more thereof. In an embodiment, the semiconductor material may be doped into n-type or p-type. The channel layer 420 may include conductive metal oxide, for another example. The conductive metal oxide may include indium gallium zinc oxide (IGZO), or indium tin oxide (ITO), etc., for example. The channel layer 420 may be formed by using a chemical vapor deposition method or an atomic layer deposition method, for example.

Then, the trench 10' in which the first ferroelectric amorphous material layer 410 and the channel layer 420 are formed may be filled with an insulation material to form a filling insulation layer 430. The insulation material may include, for example, oxide, nitride or oxynitride.

A planarization process may be performed with respect to portions of the first ferroelectric amorphous material layer 410, the channel layer 420 and the filling insulation layer 430, which are formed outside the trench 10'. As a result, as illustrated in FIG. 10, top surfaces of the ferroelectric amorphous material layer 410, the channel layer 420 and the filling insulation layer 430 may be positioned on the same plane as the top surface of the uppermost interlayer insulation layer 220h. For instance, the planarization process may be performed by a chemical mechanical polishing method.

Figure 11:
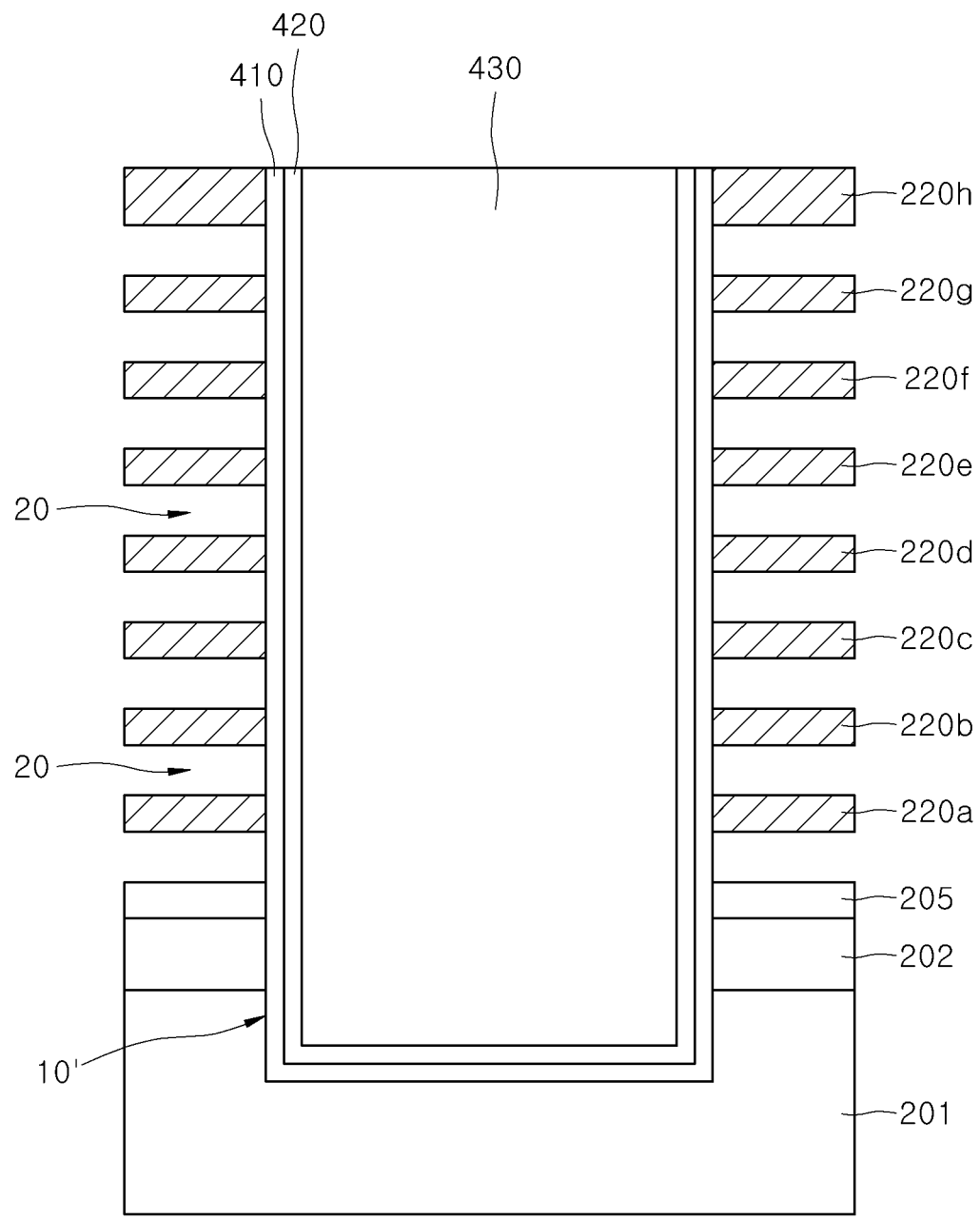

Referring to FIG. 11, the interlayer sacrificial layers 210a, 210b, 210c, 210d, 210e, 210f, 210g and 210h of the stack structure 200a may be selectively removed to form recesses 20 that selectively expose the interlayer insulation layers 220a, 220b, 220c, 220d, 220e, 220f, 220g and 220h and the first ferroelectric amorphous material layer 410. In an embodiment, the interlayer sacrificial layers 210a, 210b, 210c, 210d, 210e, 210f, 210g and 210h may be selectively removed by forming a separate trench (not shown) penetrating the stack structure 200a and providing an etchant to the trench to selectively etch the interlayer sacrificial layers 210a, 210b, 210c, 210d, 210e, 210f, 210g and 210h.

Figure 12A:
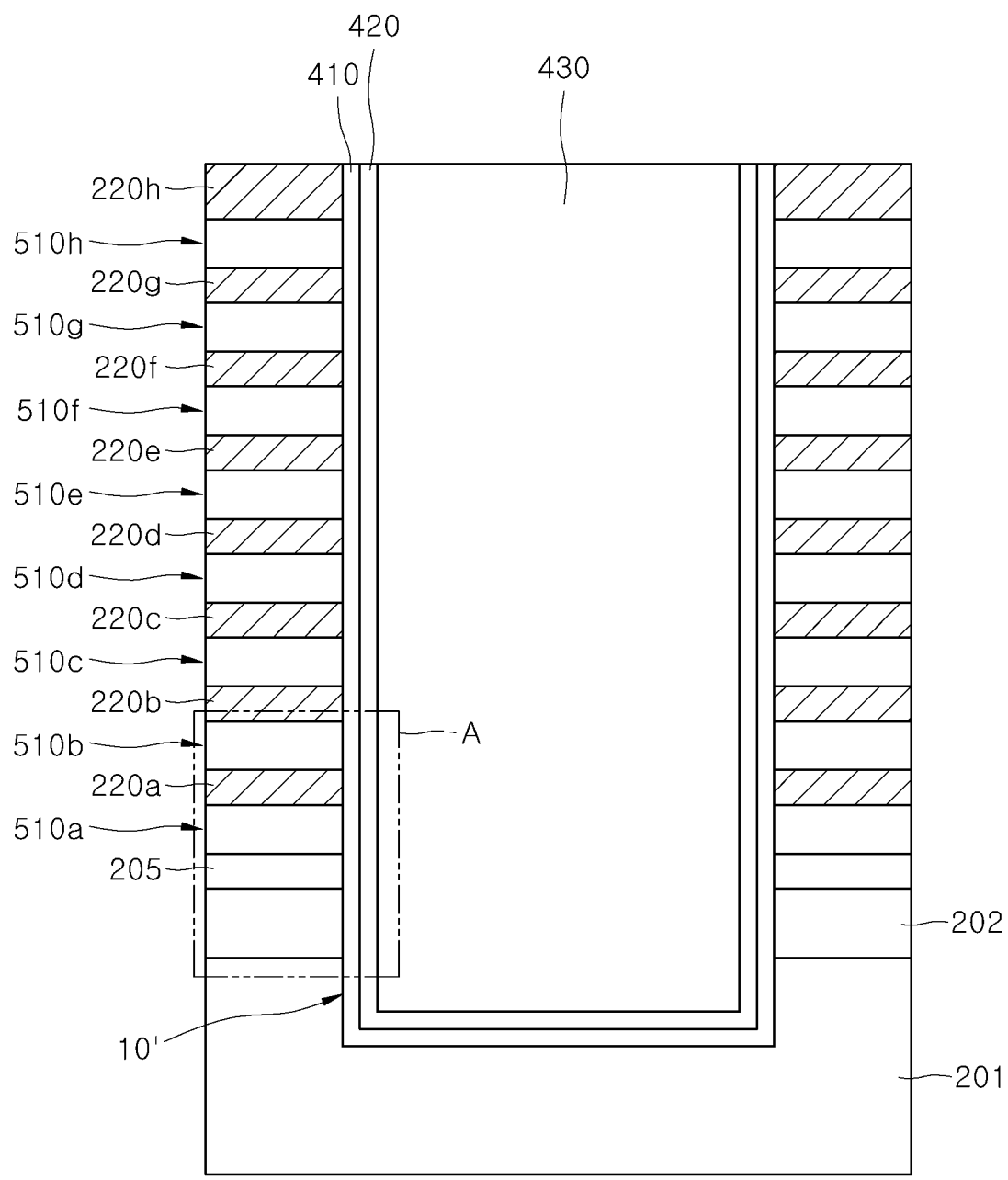
Figure 12B:
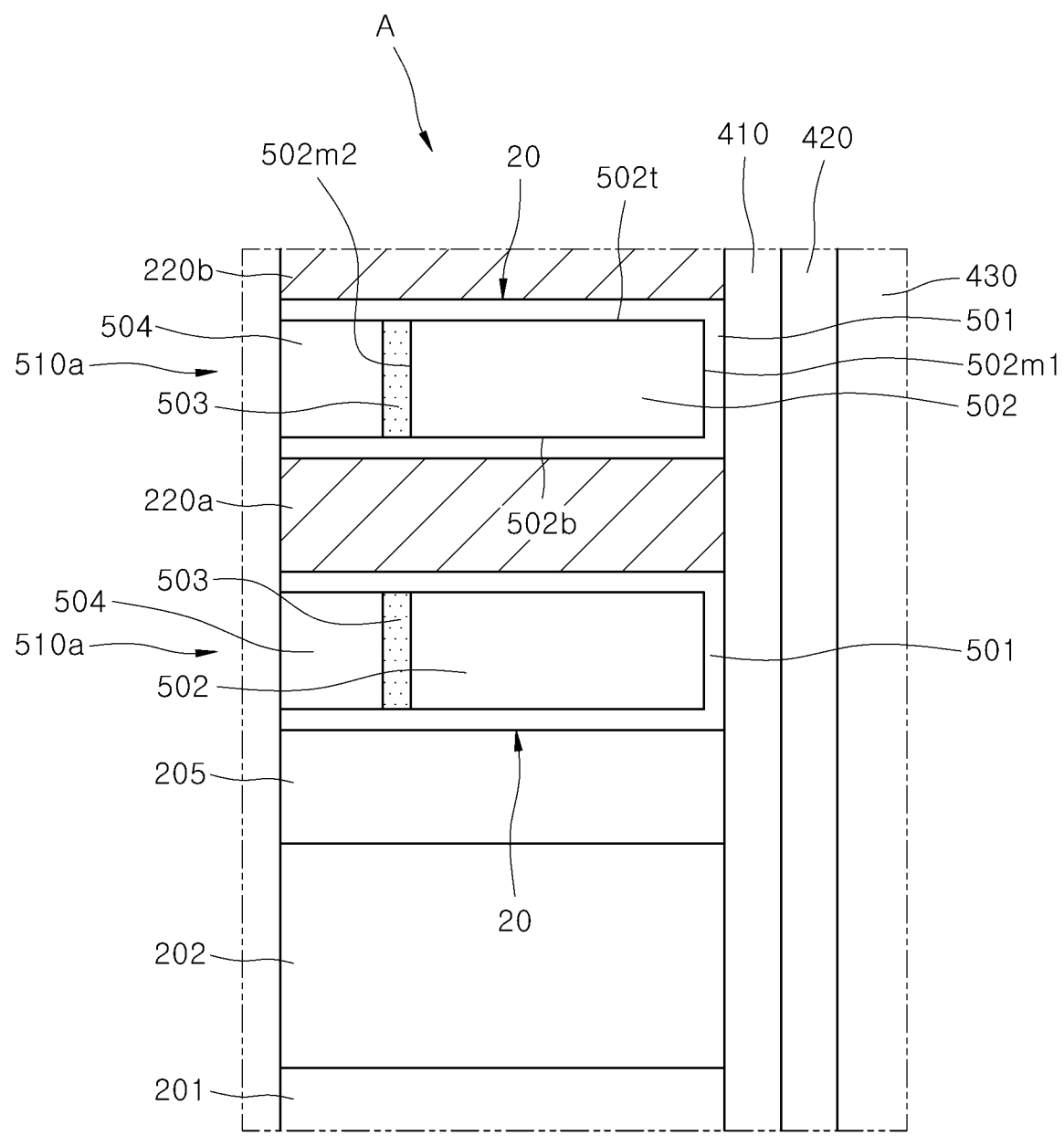

Referring to FIGS. 12A and 12B, first to eighth preliminary gate structures 510a, 510b, 510c, 510d, 510e, 510f, 510g and 510 may be formed inside the recesses 20 according to the following process. First, a ferroelectric induction layer 501 may be formed on the ferroelectric amorphous material layer 410 and the interlayer insulation layers 220a, 220b, 220c, 220d, 220e, 220f, 220g and 220h inside the recesses 20. The ferroelectric induction layer 501 may have an amorphous phase. In addition, the ferroelectric induction layer 501 may have a non-ferroelectric property, for example, a paraelectric property. The ferroelectric induction layer 501 may include an insulator. For instance, the ferroelectric induction layer 501 may include insulative metal oxide. For instance, the ferroelectric induction layer 501 may include magnesium oxide. In an embodiment, the ferroelectric induction layer 501 may have a thickness of about 1 nm to about 5 nm. The ferroelectric induction layer 501 may be formed by using a chemical vapor deposition method or an atomic layer deposition method, for example.

Then, a second ferroelectric amorphous material layer 502 may be formed on the ferroelectric induction layer 501 inside the recesses 20. Here, a top surface 502t, a bottom surface 502b and a side surface 502m1 of the second ferroelectric amorphous material layer 502 may contact the ferroelectric induction layer 501. The second ferroelectric amorphous material layer 502 may include hafnium oxide, zirconium oxide, hafnium zirconium oxide or a combination of two or more thereof, for example. The second ferroelectric amorphous material layer 502 may include a dopant. The dopant may include, for example, silicon (Si), zirconium (Zr), yttrium (Y), aluminum (Al), gadolinium (Gd), strontium (Sr), lanthanum (La), or a combination of two or more thereof. The second ferroelectric amorphous material layer 502 may be formed by using a chemical vapor deposition method or an atomic layer deposition method, for example. In an embodiment, the lattice constant of crystalline dielectric layers after each of the first and second ferroelectric amorphous material layers 410 and 502 are crystallized may differ from the lattice constant of the ferroelectric induction layer 501. Accordingly, the ferroelectric induction layer 501 may apply stress to the first and second ferroelectric amorphous material layers 410 and 502 during a crystallization process of FIGS. 13A and 13B to be described later.

A gate electrode layer 503 may be formed on a side surface 502m2 of the second ferroelectric amorphous material layer 502. The gate electrode layer 503 may include a conductor. In an embodiment, the lattice constant of the gate electrode layer 503 may differ from the lattice constant of a crystalline dielectric layer after the second ferroelectric amorphous material layer 502 is crystallized. Accordingly, the gate electrode layer 503 may function as a ferroelectric induction layer with respect to the second ferroelectric amorphous material layer 502 during the crystallization process of FIGS. 13A and 13B to be described later. The gate electrode layer 503 may have a thickness of about 5 nm to about 15 nm in the vertical direction. The gate electrode layer 503 may include, for example, tungsten (W), titanium (Ti), tantalum (Ta), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. When the gate electrode 503 functions as a ferroelectric induction layer with respect to the second ferroelectric amorphous material layer 502, the gate electrode layer 503 may include, for example, titanium nitride. The gate electrode layer 503 may be formed by using a chemical vapor deposition method or an atomic layer deposition method, for example.

A conductive layer 504 may be formed on the gate electrode layer 503. The conductive layer 504 may include a conductive material having a lower resistivity than the gate electrode layer 503. The conductive layer 504 may be formed to contact the gate electrode layer 503 and the ferroelectric induction layer 501. The conductive layer 504 may be formed by using a chemical vapor deposition method or an atomic layer deposition method, for example. In some other embodiments, the conductive layer 504 may be omitted by increasing the thickness of the gate electrode layer 503 in the lateral direction (i.e., the x-direction). The first to eighth preliminary gate structures 510a, 510b, 510c, 510d, 510e, 510f, 510g and 510h illustrated in FIGS. 12A and 12B can be formed through the above-described process.

Figure 13A:
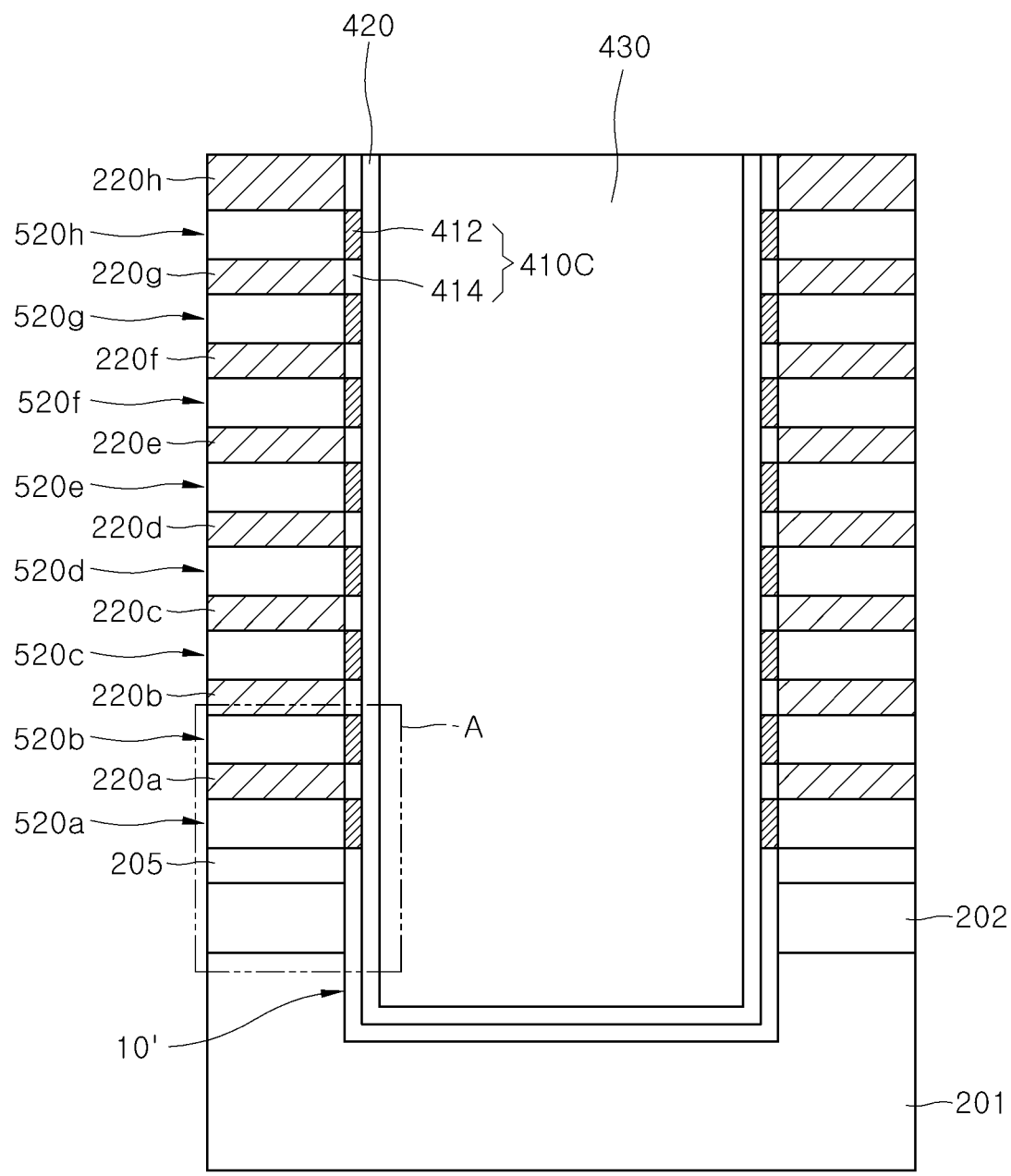
Figure 13B:
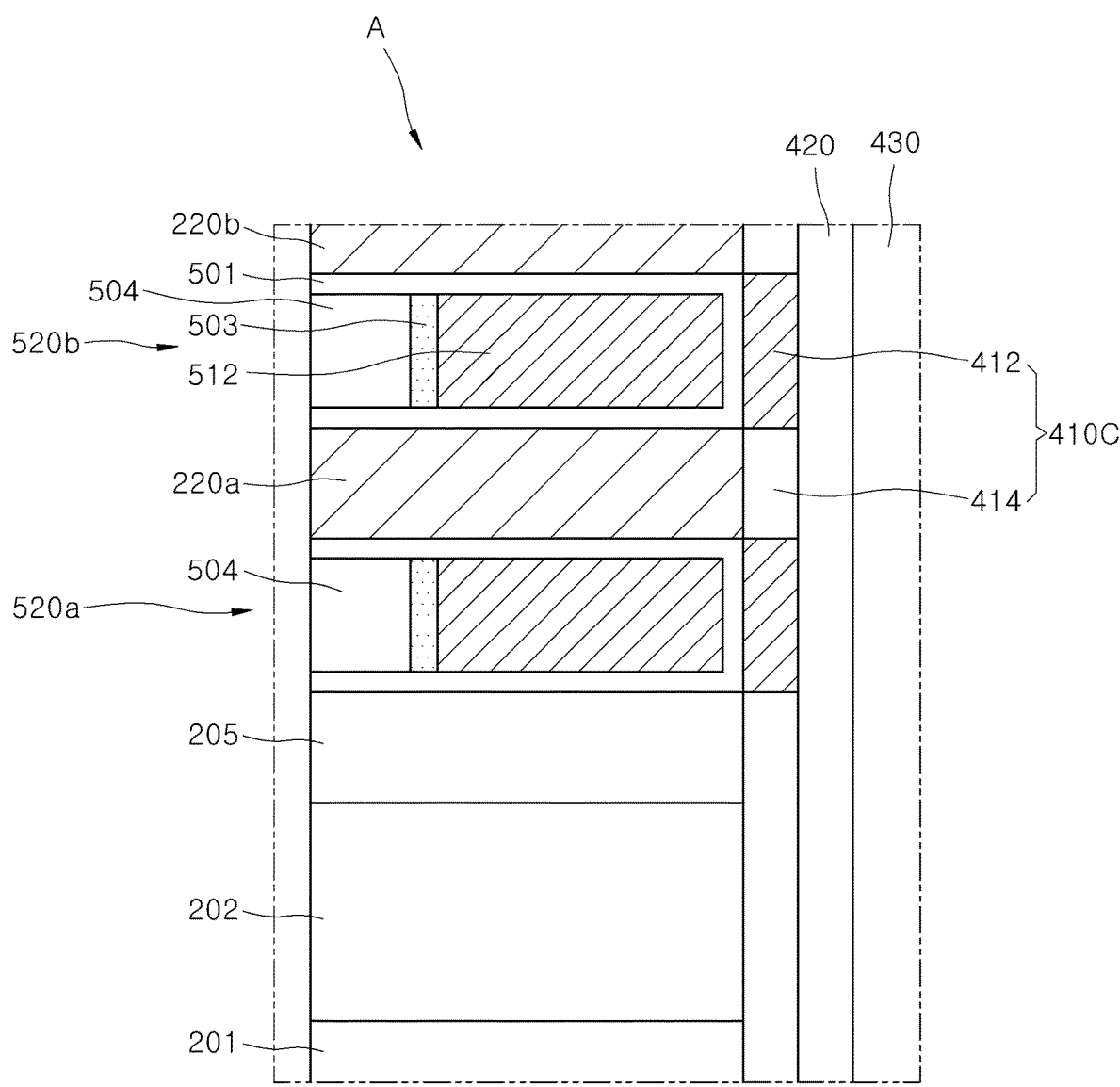

Referring to FIGS. 13A and 13B, crystallization heat treatment may be performed with respect to the first and second ferroelectric amorphous material layers 410 and 502, using the ferroelectric induction layer 501, to form a first to eighth gate structures 520a, 520b, 520c, 520d, 520e, 520f, 520g and 520h. The crystallization heat treatment may be performed at a process temperature of 500° C. to 1000° C., for example. In an embodiment, the crystallization heat treatment process may be performed by converting portions of the first and second ferroelectric amorphous material layers 410 and 502 in contact with the ferroelectric induction layer 501 into crystalline ferroelectric layers having ferroelectric properties. Accordingly, portions of the first ferroelectric amorphous material layer 410 in contact with the ferroelectric induction layer 501 may be converted into ferroelectric portions 412 of a first gate dielectric layer 410C. In addition, portions of the first ferroelectric amorphous material layer 410 in contact with the first to eighth interlayer insulation layers 220a, 220b, 220c, 220d, 220e, 220f, 220g and 220h may be converted into non-ferroelectric portions 414 of the first gate dielectric layer 410C.

Meanwhile, as the second ferroelectric amorphous material layer 502 is disposed such that the top surface 502t, the side surface 502m1 and the bottom surface 502b thereof are surrounded by the ferroelectric induction layer 501, as illustrated in FIG. 12B, the entire second ferroelectric amorphous material layer 502 may be converted into the ferroelectric second gate dielectric layer 512 during the crystallization heat treatment. In an embodiment, as described above, the gate electrode layer 503 may additionally function as a ferroelectric induction layer for the second ferroelectric amorphous material layer 502.

In an embodiment, when the crystallization heat treatment is performed, the ferroelectric induction layer 501 may induce the first and second ferroelectric amorphous material layers 410 and 502 to transform into layers with a predetermined ferroelectric crystal structure. For instance, the ferroelectric portions 412 of the first gate dielectric layer 410C and the second gate dielectric layer 512 may each have a crystal structure of an orthorhombic system, and the non-ferroelectric portions 414 of the first gate dielectric layer 410C may each have a crystal structure of a tetragonal system or a monoclinic system.

Figure 14A:
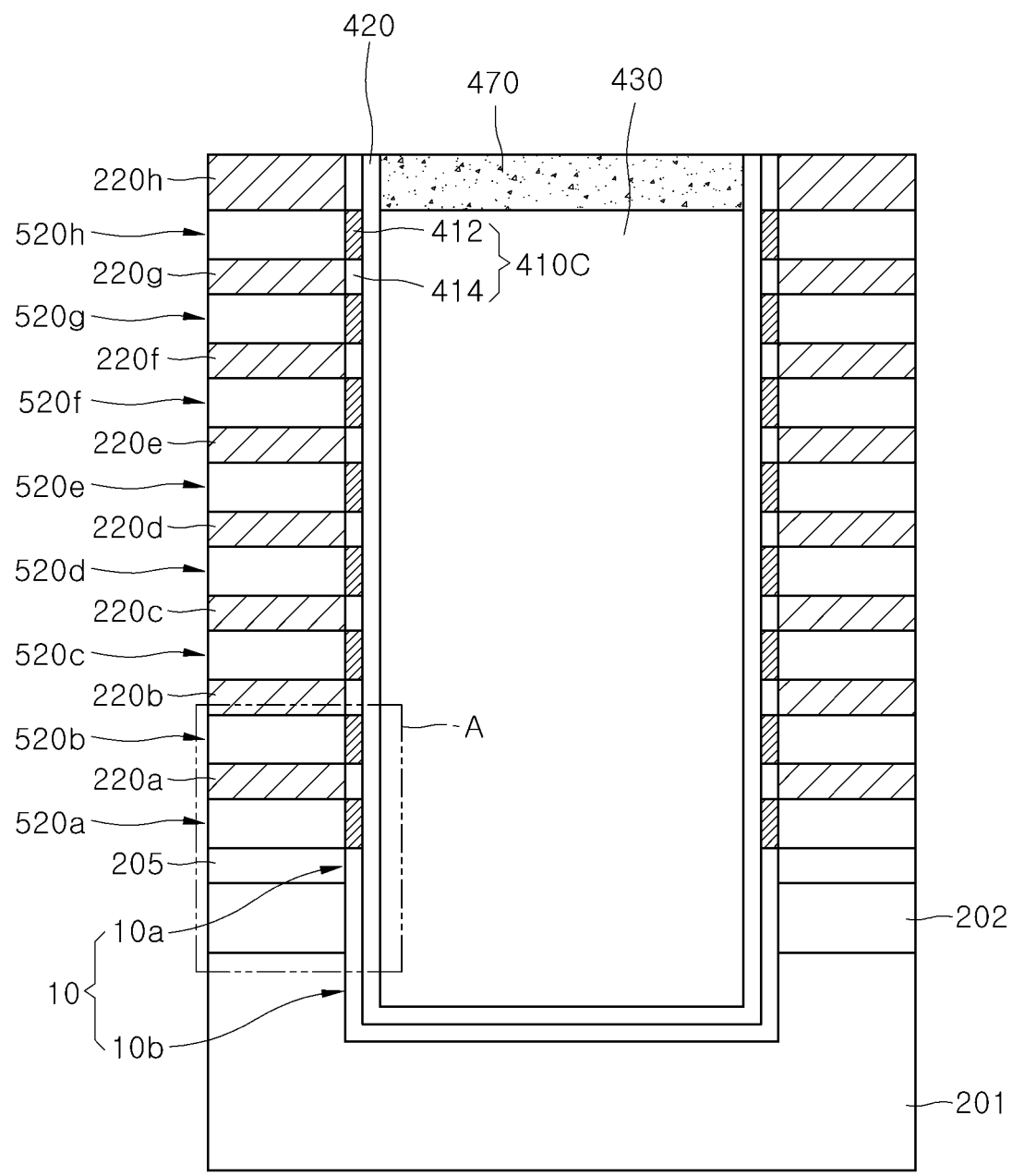
Figure 14B:
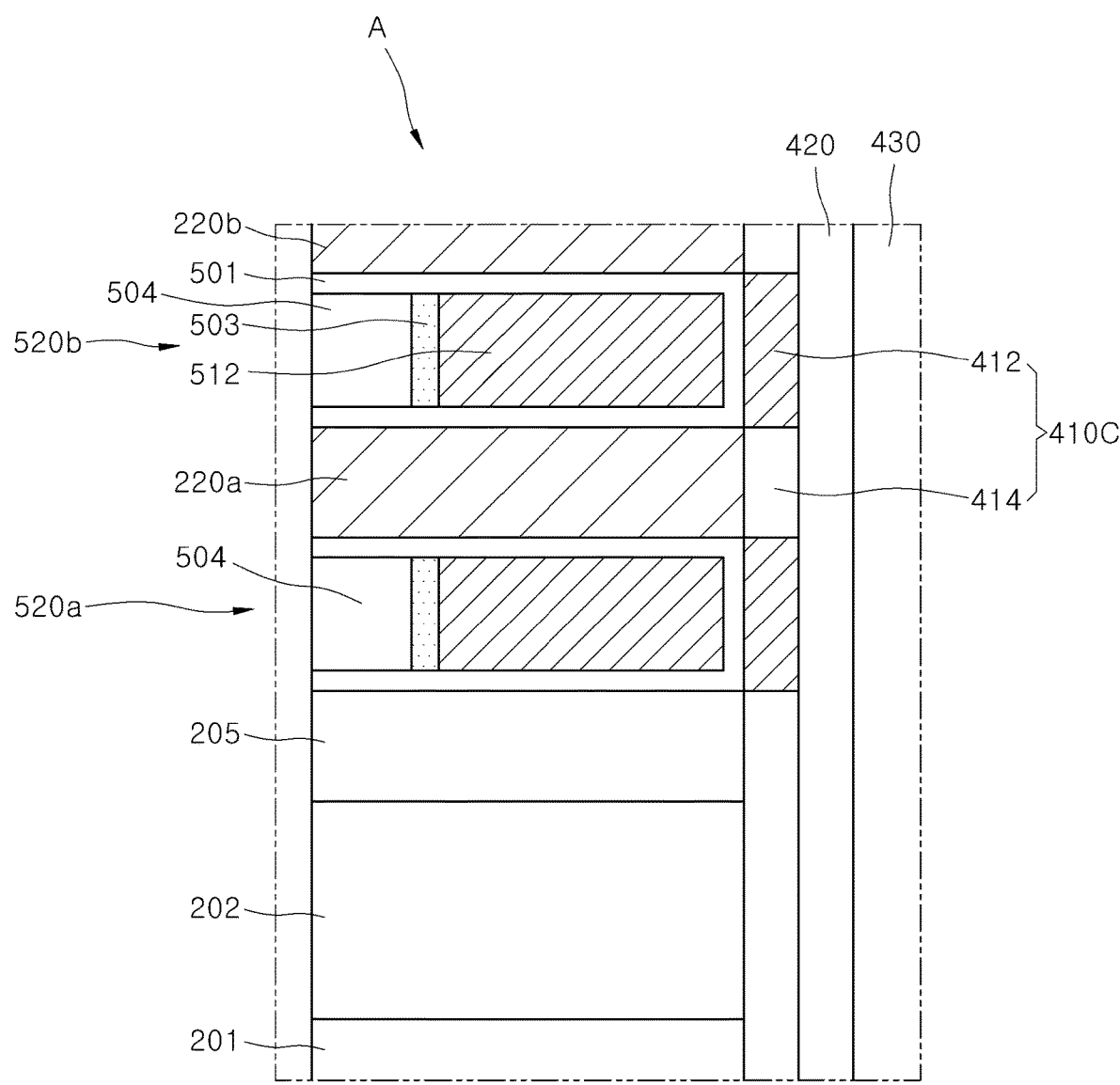

Referring to FIGS. 14A and 14B, an upper portion of the filling insulation layer 430 may be selectively etched to form a recess. Then, the recess may be filled with a conductive material to form a channel contact layer 470. The conductive material may include, for example, a semiconductor material doped into n-type or p-type. As a specific example, the conductive material may be n-type doped silicon. The channel contact layer 470 may be formed to contact the channel layer 420 in the lateral direction (i.e., the x-direction).

Figure 15A:
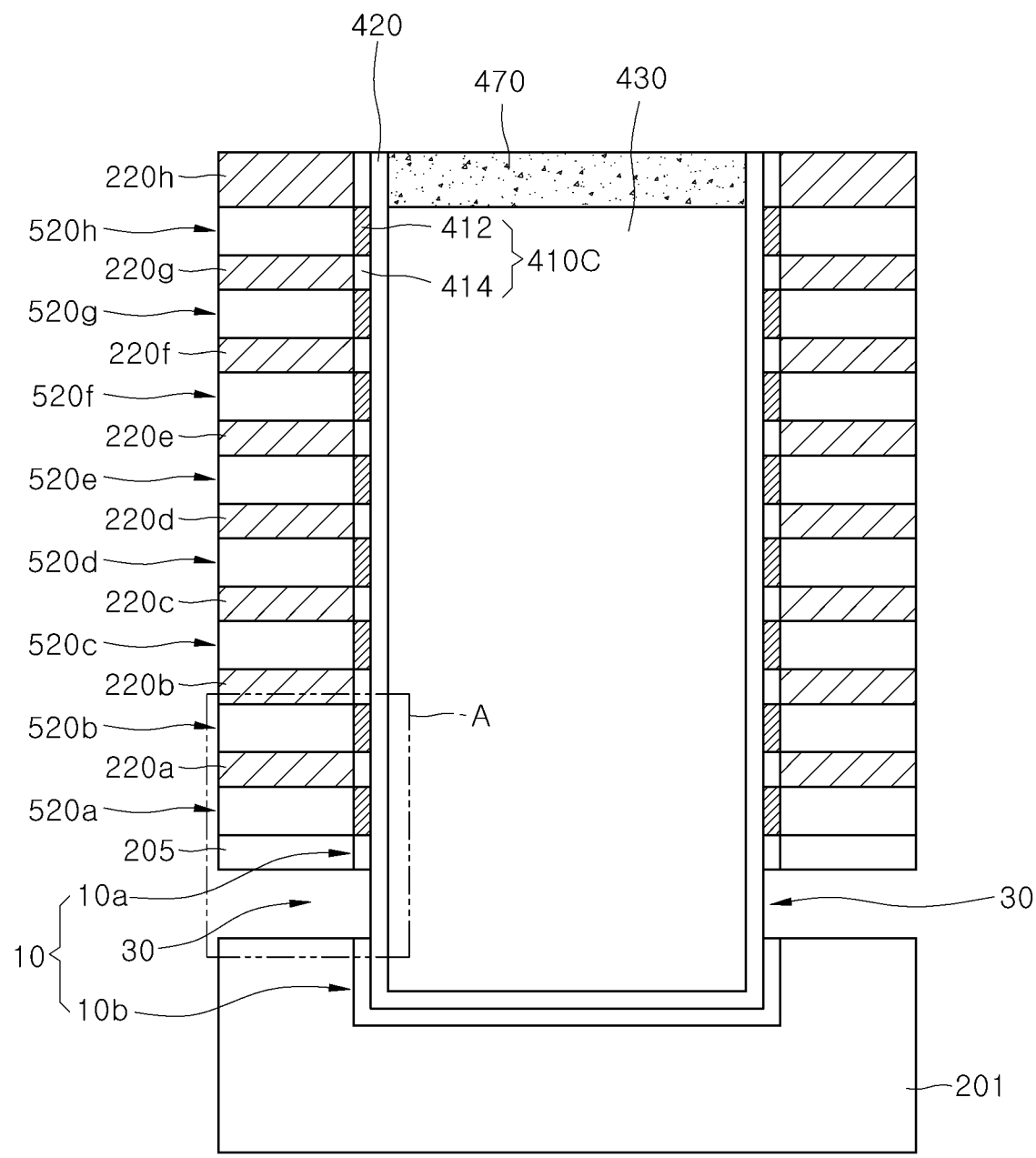
Figure 15B:
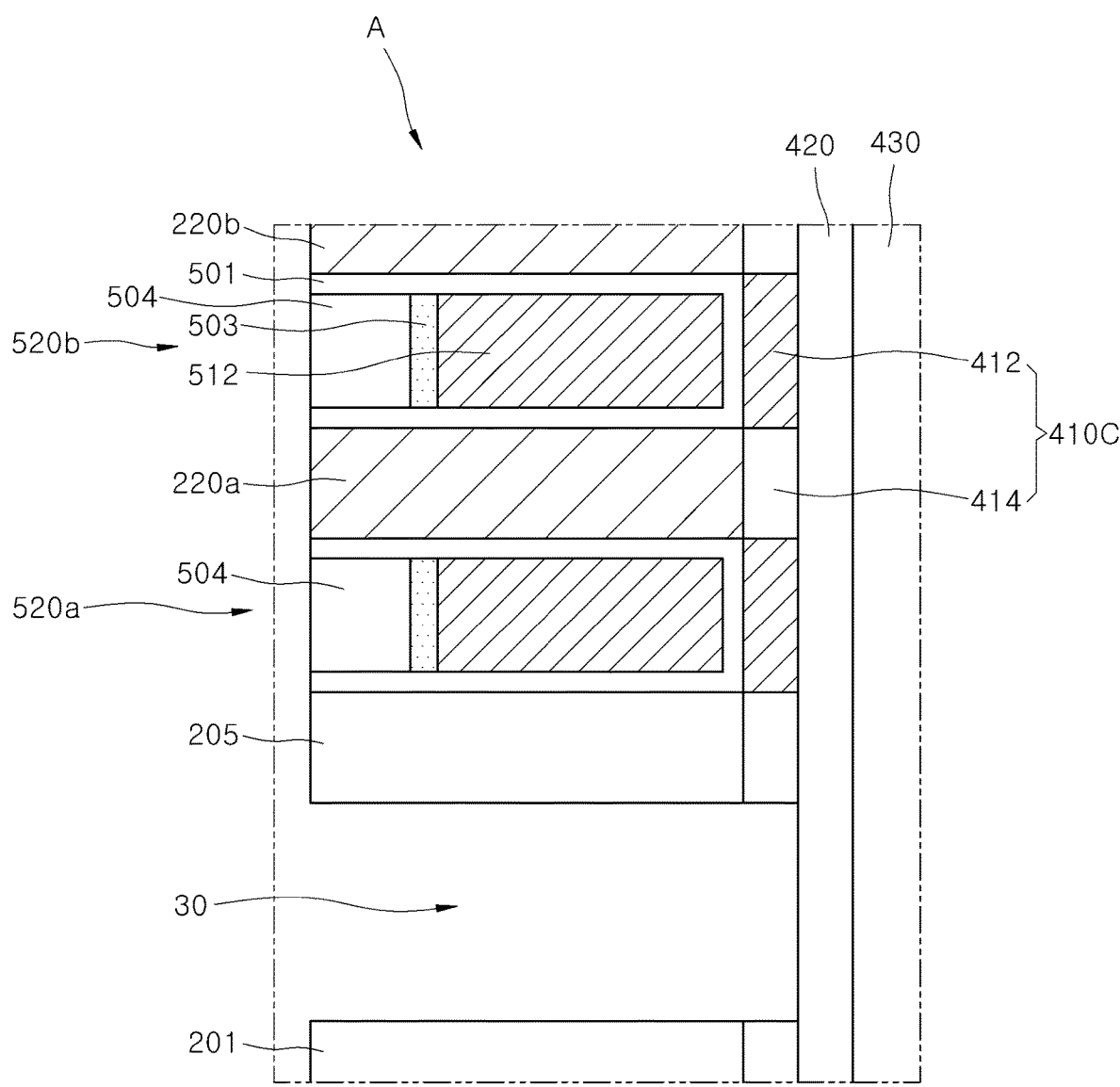

Referring to FIGS. 15A and 15B, a trench (not shown) may be formed to penetrate the first to eighth gate structures 520a, 520b, 520c, 520d, 520e, 520f, 520g and 520h, the first to eighth interlayer insulation layers 220a, 220b, 220c, 220d, 220e, 220f, 220g and 220h, and the source insulation layer 205 to expose the sacrificial layer 202. Then, the sacrificial layer 202 may be etched and removed by providing an etchant to the trench. After removing the sacrificial layer 202, the non-ferroelectric portions 414 of the first gate dielectric layer 410C exposed in the lateral direction may be etched to form a side recess spaces 30 exposing the channel layer 420. As the side recess spaces 30 are formed, the trench 10' may be converted into a trench 10 including a first portion 10a and a second portion 10b that are separated from each other.

Figure 16A:
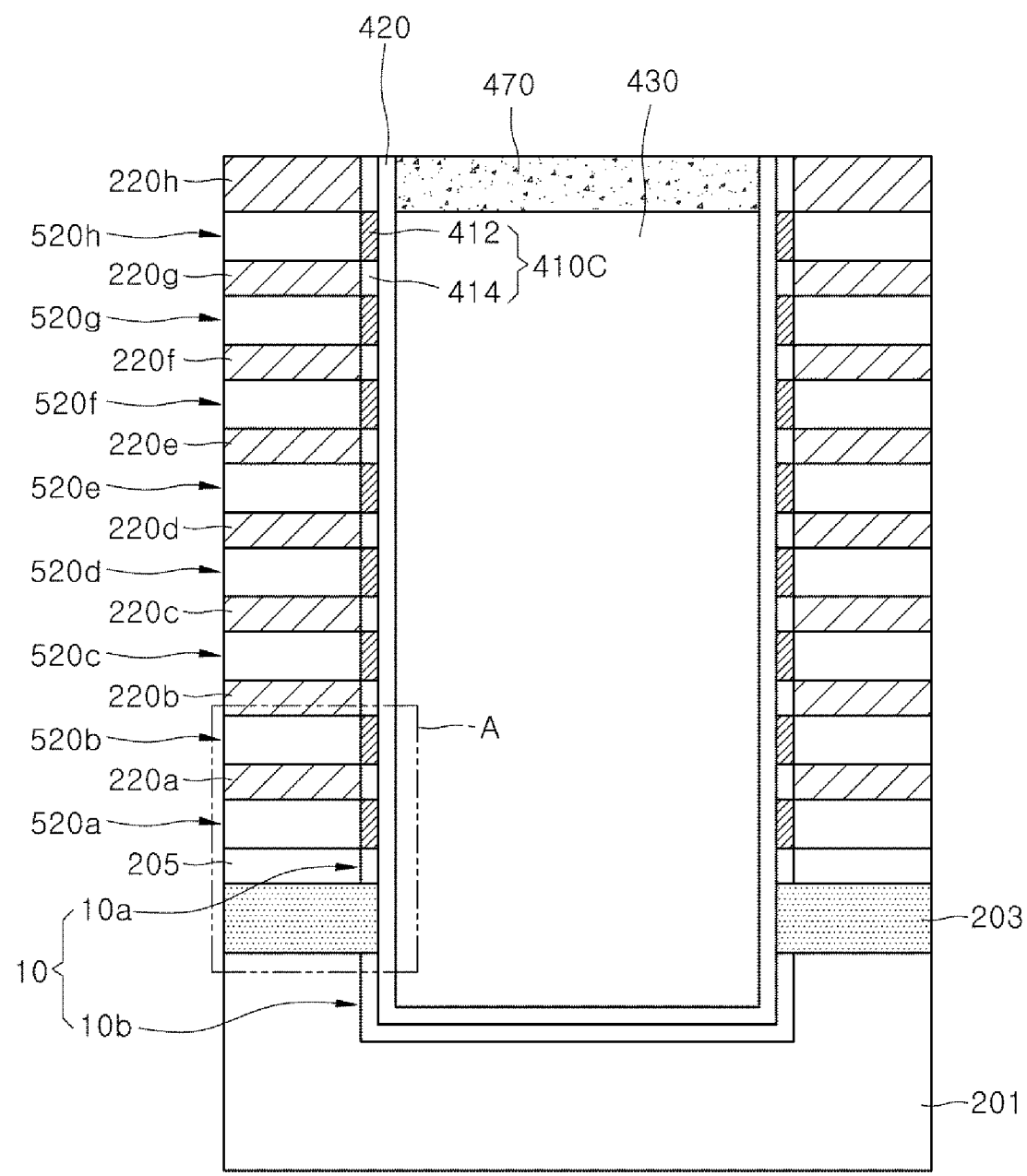
Figure 16B:
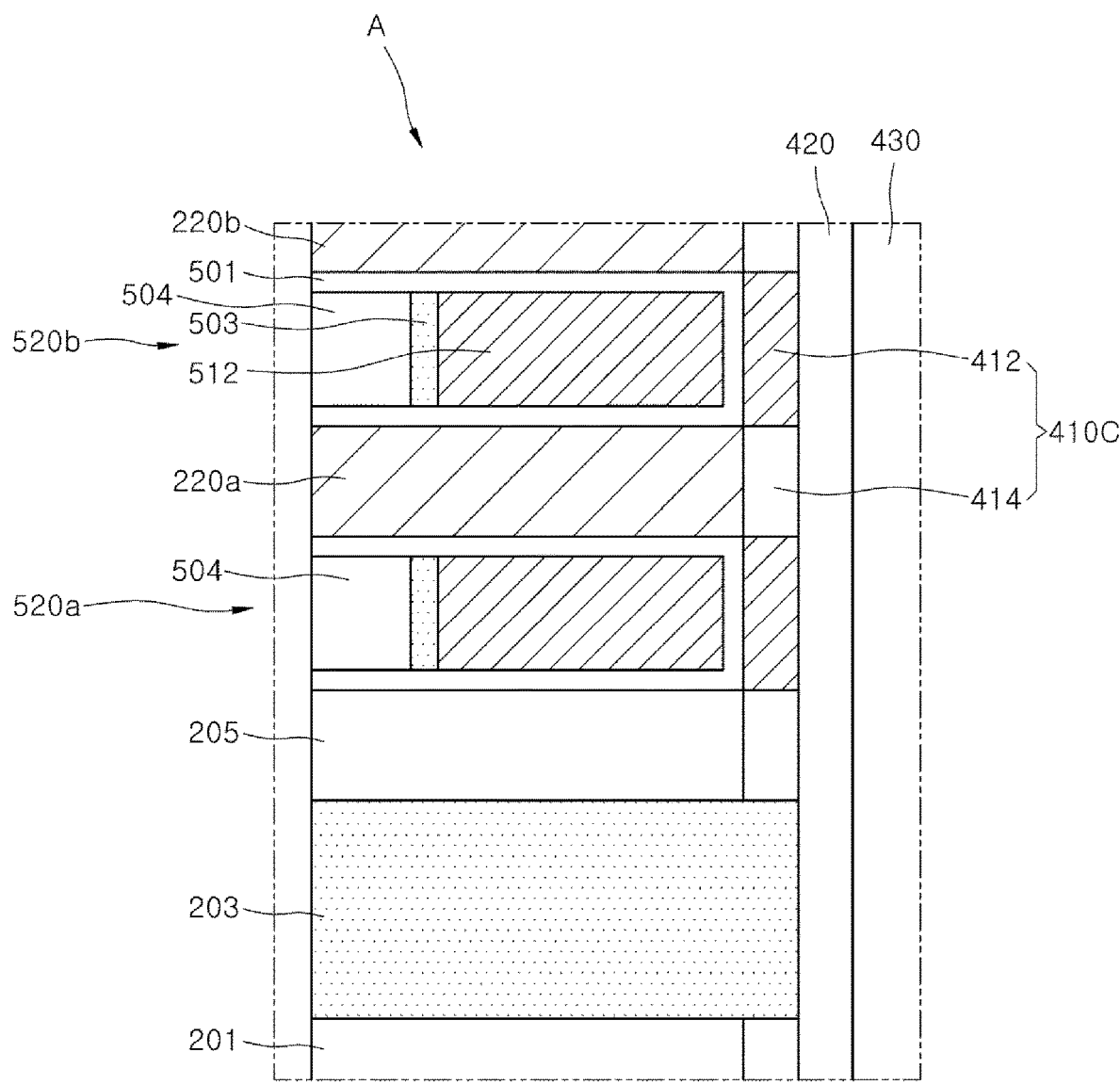

Referring to FIGS. 16A and 16B, the side recess space 30 may be filled with a conductive material to form a source contact layer 203. The conductive material may include, for example, semiconductor doped into n-type or p-type. As a specific example, the conductive material may be n-type doped silicon. The source contact layer 203 may be formed to contact a portion of the channel layer 420.

Through the above-described process, a ferroelectric memory device according to an embodiment of the present disclosure can be manufactured. As described above, crystallization heat treatment may be performed with respect to the first and second ferroelectric amorphous material layers while a ferroelectric induction layer including an insulator contacts the first and second ferroelectric amorphous material layers, respectively. Accordingly, a crystalline gate dielectric layer having a ferroelectric property can be effectively transformed from the first and second ferroelectric amorphous material layers.

Figure 17A:
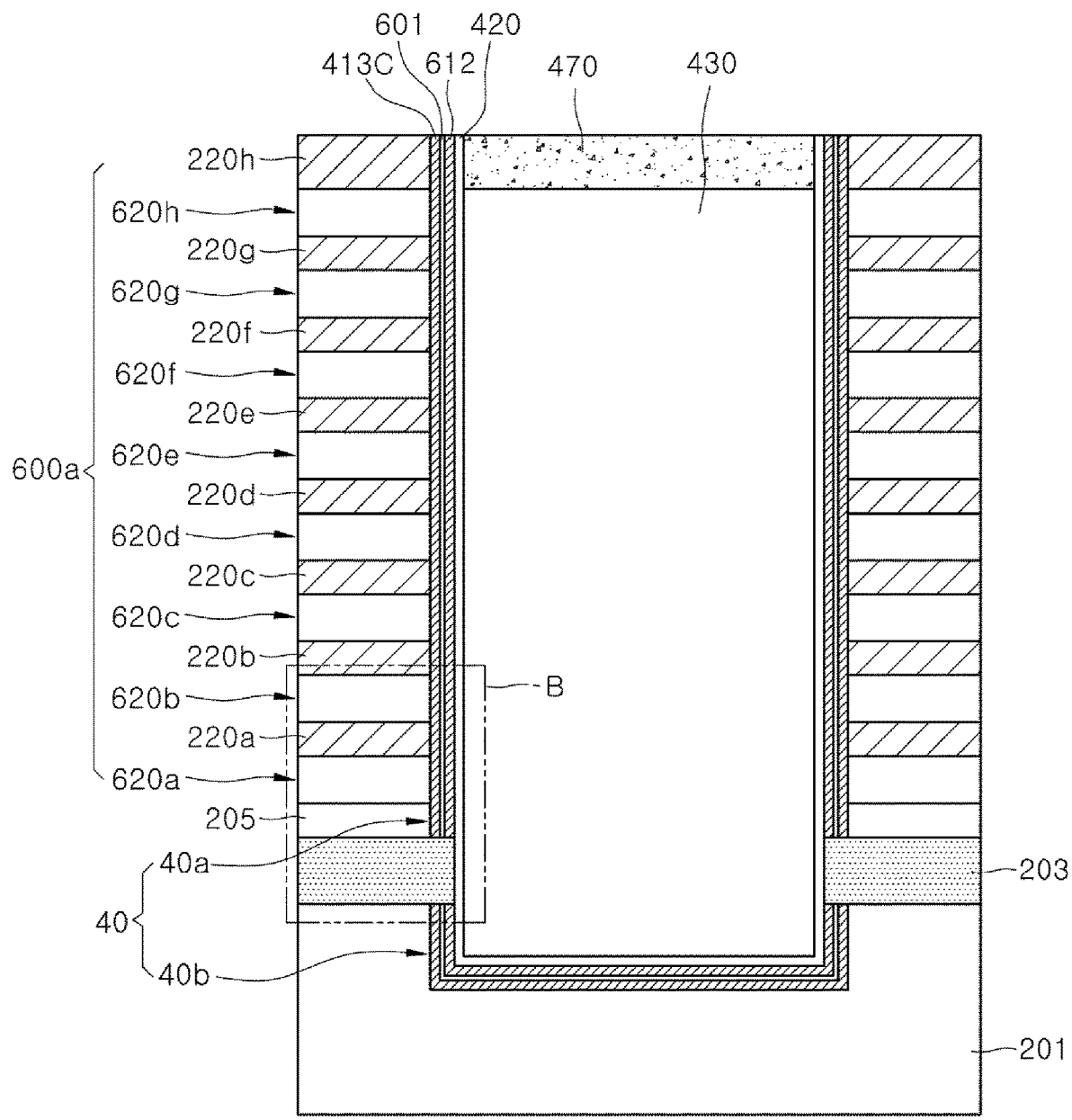
FIG. 17A is a cross-sectional view schematically illustrating a ferroelectric memory device according to an embodiment of the present disclosure.
Figure 17B:
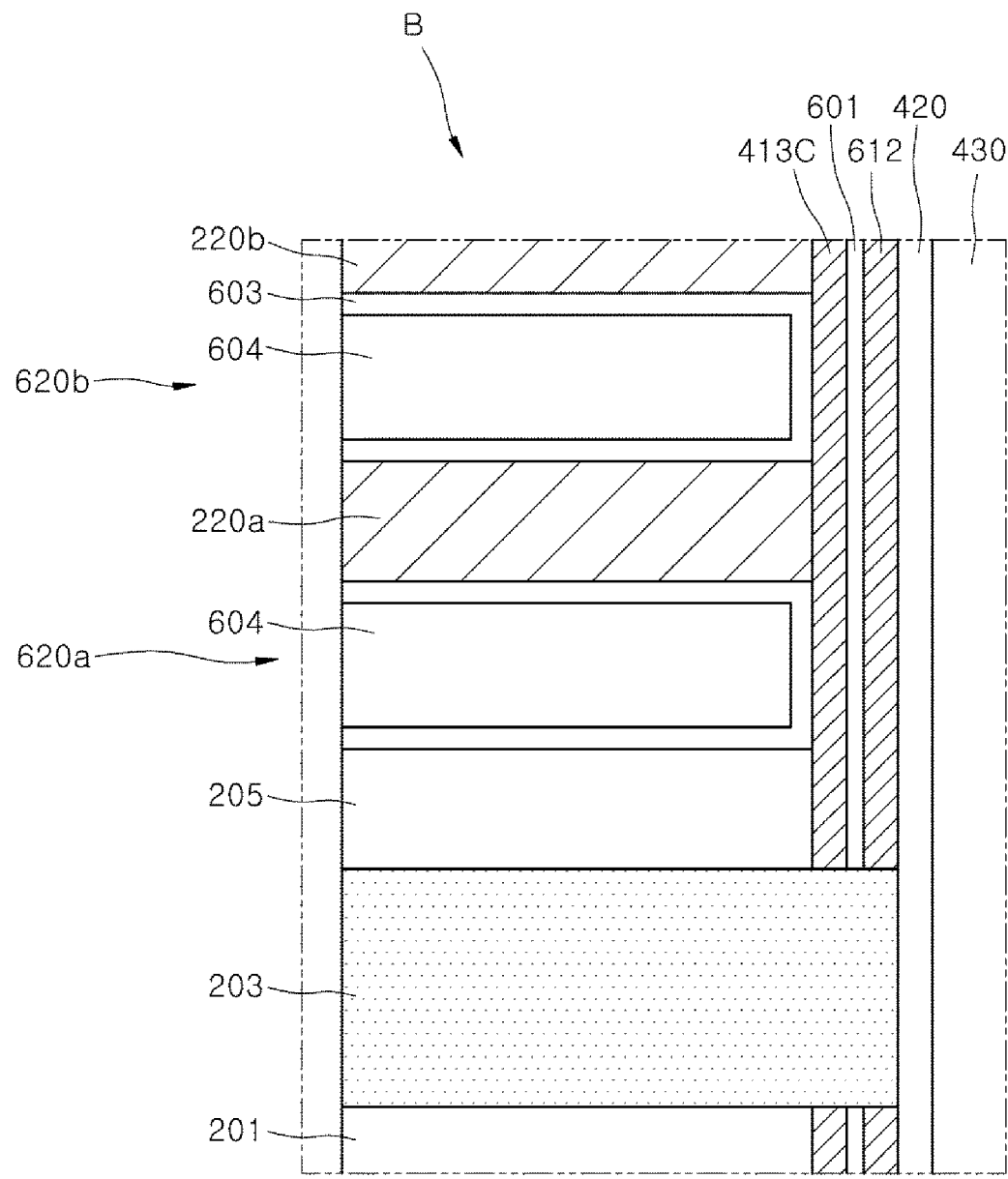
FIG. 17B is an enlarged view of the region 'B' of FIG. 17A.

FIG. 17A is a cross-sectional view schematically illustrating a ferroelectric memory device 4 according to an embodiment of the present disclosure and FIG. 17B is an enlarged view of the region 'B' of FIG. 17A. FIG. 17B illustrates components not shown for convenience in FIG. 17A. The ferroelectric memory device 4 can be distinguished in the configuration of a first gate dielectric layer 413C, a ferroelectric induction layer 601, a second gate dielectric layer 612 and a gate electrode layer 603 in comparison with the ferroelectric memory device 3 described above with reference to FIGS. 7A and 7B.

Referring to FIG. 17A, the ferroelectric memory device 4 may include a substrate 201, and a gate stack 600a on the substrate 201. The gate stack 600a may include first to eighth gate structures 620a, 620b, 620c, 620d, 620e, 620f, 620g and 620h and first to eighth interlayer insulation layers 220a, 220b, 220c, 220d, 220e, 220f, 220g and 220h, which are alternately stacked in a direction perpendicular to the substrate 201 (the z-direction).

The first to eighth gate structures 620a, 620b, 620c, 620d, 620e, 620f, 620g and 620h may be electrically connected to a lower selection line (not shown), a word line (not shown) and an upper selection line (not shown) of the ferroelectric memory device 2 described above with reference to FIG. 6. The first to eighth gate structures 620a, 620b, 620c, 620d, 620e, 620f, 620g and 620h will be described in detail using FIG. 17B below.

The ferroelectric memory device 4 may include a trench 40 having a first portion 40a and a second portion 40b. The first portion 40a of the trench 40 may be formed to penetrate the gate stack 600a on the substrate 201, and the second portion 40b may have a shape discontinuously extending below the first portion 40a and may be formed in the substrate 201. Specifically, the first portion 40a of the trench 40 may expose side surfaces of the first to eighth gate structures 620a, 620b, 620c, 620d, 620e, 620f, 620g and 620h and side surfaces of the first to eighth interlayer insulation layers 220a, 220b, 220c, 220d, 220e, 220f, 220g and 220h.

The ferroelectric memory device 4 may include a first gate dielectric layer 413C disposed along an inner surface of the trench 40. The first gate dielectric layer 413C may be disposed to cover the first to eighth gate structures 620a, 620b, 620c, 620d, 620e, 620f, 620g and 620h and first to eighth interlayer insulation layers 220a, 220b, 220c, 220d, 220e, 220f, 220g and 220h along the inner surface of the first portion 40a of the trench 40. In addition, the first gate dielectric layer 413C may be disposed to cover the substrate 201 along an inner surface of the second portion 40b of the trench 40.

The first gate dielectric layer 413C may include, for example, hafnium oxide, zirconium oxide, hafnium zirconium oxide, or a combination of two or more thereof. The first gate dielectric layer 413C may have a crystalline phase as a whole. As an example, the first gate dielectric layer 413C may have the same tetragonal crystal structure as a whole. The first gate dielectric layer 413C may have a thickness of about 5 nm to about 15 nm in a direction perpendicular to an inner surface of the trench 40.

The ferroelectric induction layer 601 may be disposed on the first gate dielectric layer 413C in the trench 40 in first portion 40a and second portion 40b. The ferroelectric induction layer 601 may have a non-ferroelectric property. As an example, the ferroelectric induction layer 601 may have a paraelectric property. The ferroelectric induction layer 601 may have a crystalline phase. In addition, the ferroelectric induction layer 601 may include an insulator. In an embodiment, the ferroelectric induction layer 601 may include insulative metal oxide. As an example, the ferroelectric induction layer 601 may include magnesium oxide. In an embodiment, the ferroelectric induction layer 601 may have a thickness of about 1 nm to about 5 nm in a direction perpendicular to an inner surface of the trench 40. The ferroelectric induction layer 601 does not cover a side surface of source contact layer 203.

The second gate dielectric layer 612 may be disposed on the ferroelectric induction layer 601 in the trench 40. The second gate dielectric layer 612 may include, for example, hafnium oxide, zirconium oxide, hafnium zirconium oxide, or a combination of two or more thereof. The second gate dielectric layer 612 may have a crystalline phase. As an example, the second gate dielectric layer 612 may have a crystal structure of a tetragonal system. The second gate dielectric layer 612 may have a thickness of about 5 nm to about 15 nm in a direction perpendicular to an inner surface of the trench 40. The second gate dielectric layer 612 does not cover a side surface of source contact layer 203.

The channel layer 420 may be disposed on the second gate dielectric layer 612. The channel layer 420 may be disposed to cover the second gate dielectric layer 612. In addition, the channel layer 420 may be disposed to contact a side surface of the source contact layer 203. Accordingly, the channel layer 420 may be electrically connected to the source contact layer 203. Meanwhile, a filling insulation layer 430 may be used to fill the trench 40. A channel contact layer 470 may be disposed on the filling insulation layer 430.

Referring to FIG. 17B, the first to eighth gate structures 620a, 620b, 620c, 620d, 620e, 620f, 620g and 620h may each include a gate electrode layer 603 and a conductive layer 604. The gate electrode layer 603 may contact the first to eighth interlayer insulation layers 220a, 220b, 220c, 220d, 220e, 220f, 220g and 220h and the first gate dielectric layer 413C. The gate electrode layer 603 may include, for example, tungsten (W), titanium (Ti), tantalum (Ta), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In an embodiment, the gate electrode layer 603 may have a lattice constant different from that of the first gate dielectric layer 413C. Consequently, the gate electrode layer 603 may function as a ferroelectric induction layer during crystallization of the first gate dielectric layer 413C in a manufacturing process to be described. The conductive layer 604 may include a conductive material having a lower resistivity than the gate electrode layer 603. The conductive layer 604 may be disposed on the gate electrode layer 603.

In the above-described embodiment, the first gate dielectric layer 413C, the ferroelectric induction layer 601 and the second gate dielectric layer 612 may be sequentially disposed on the inner surface of the trench 40. The ferroelectric induction layer 601 may induce stress into first and second gate dielectric layers 413C and 612 at the same time in a crystallization process. Accordingly, each of the first and second gate dielectric layers 413C and 612 can have a stable ferroelectric property. In some embodiments, the gate electrode layer 603 may function as a ferroelectric induction layer with respect to the first gate dielectric layer 413C, thereby also improving the stability of a ferroelectric property of the first gate dielectric layer 413C.

FIGS. 18A to 22A, and FIGS. 18B to 22B are cross-sectional views schematically illustrating a method of manufacturing a ferroelectric memory device according to an embodiment of the present disclosure. The method may be used to manufacture the ferroelectric memory device 4 described above with reference to FIGS. 17A and 17B.

First, a manufacturing process substantially the same as the manufacturing process described above with reference to FIGS. 8 and 9 may be performed. A sacrificial layer 202 and a source insulation layer 205 may be formed on a substrate 201. A stack structure including interlayer sacrificial layers 210a, 210b, 210c, 210d, 210e, 210f, 210g and 210h and interlayer insulation layers 220a, 220b, 220c, 220d, 220e, 220f, 220g and 220h, which are alternately stacked with each other, may be formed on the source insulation layer 205. Then, a trench 40' penetrating the stack structure into the substrate 201 may be formed.

Figure 18A:
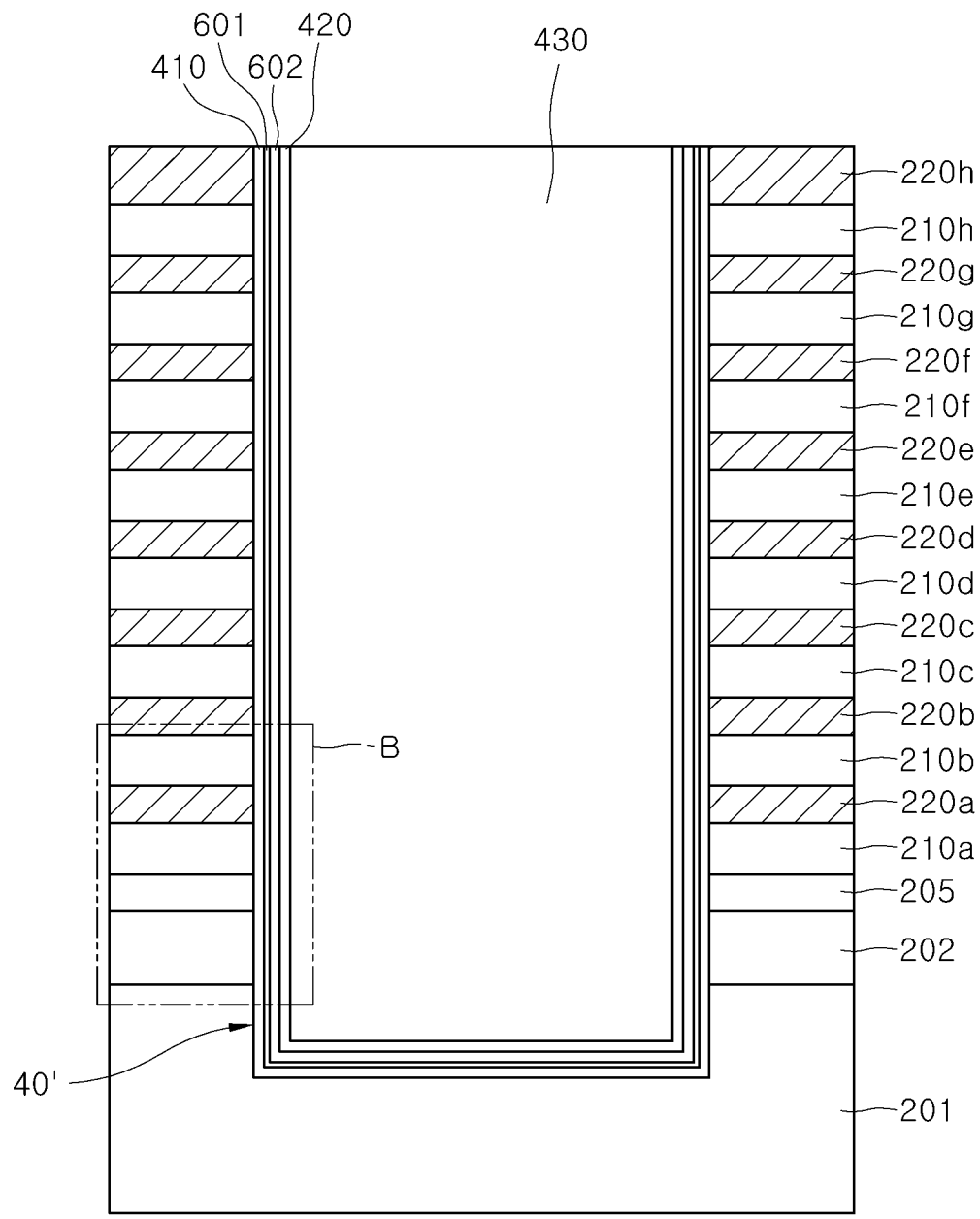
Figure 18B:
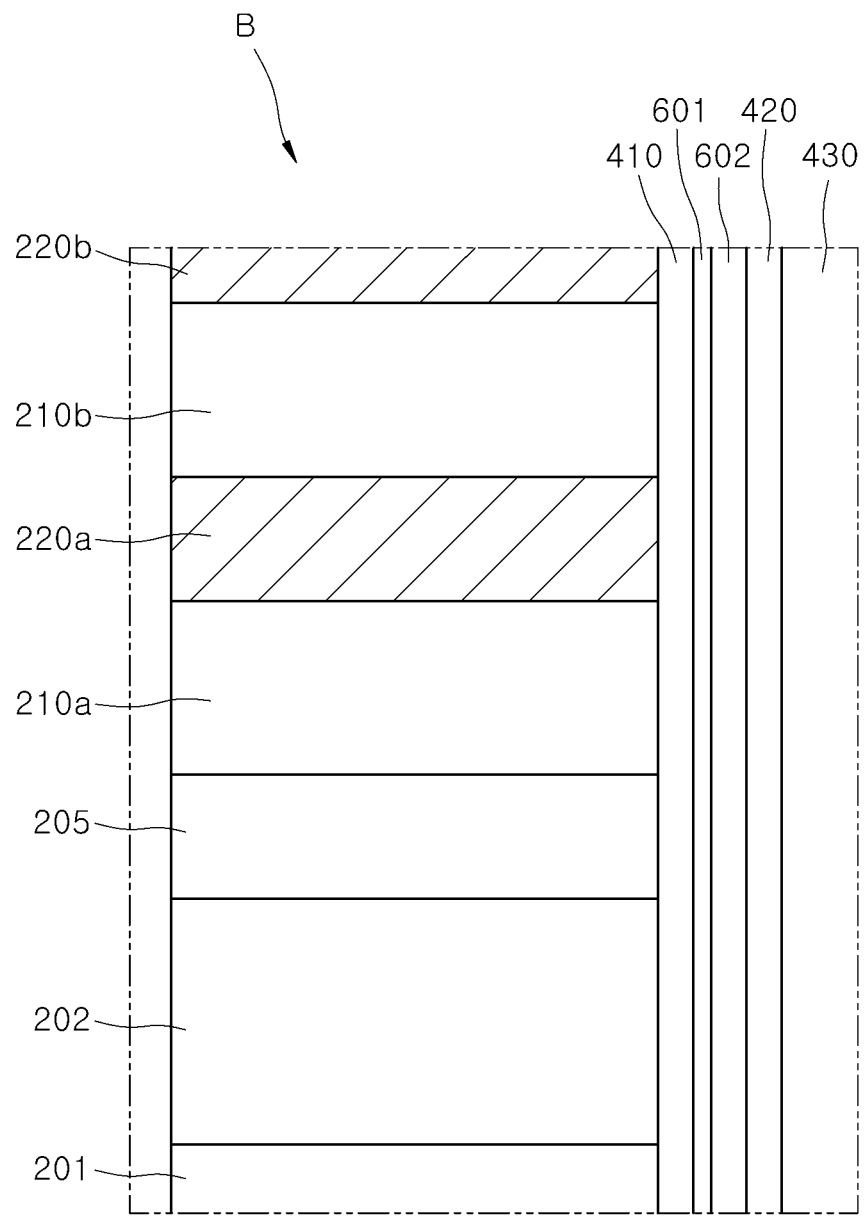

Referring to FIG. 18A, a first ferroelectric amorphous material layer 410, a crystalline ferroelectric induction layer 601, a second ferroelectric amorphous material layer 602, and a channel layer 420 may be sequentially formed on an inner surface of the trench 40'. The first ferroelectric amorphous material layer 410, the crystalline ferroelectric induction layer 601, the second ferroelectric amorphous material layer 602, and the channel layer 420 may be formed using a chemical vapor deposition method, an atomic layer deposition method, etc., for example. The first and second ferroelectric amorphous material layers 410 and 602 may each be formed to have a thickness of about 5 nm to about 15 nm, and the ferroelectric induction layer 601 may be formed to have a thickness of about 1 nm to about 5 nm.

A filling insulation layer 430 may be formed thereafter, and portions of the first ferroelectric amorphous material layer 410, crystalline ferroelectric induction layer 601, second ferroelectric amorphous material layer 602, channel layer 420 and filling insulation layer 430 formed outside the trench 40' may be planarized. This process may be substantially the same as the process described above with reference to FIG. 10.

Figure 19A:
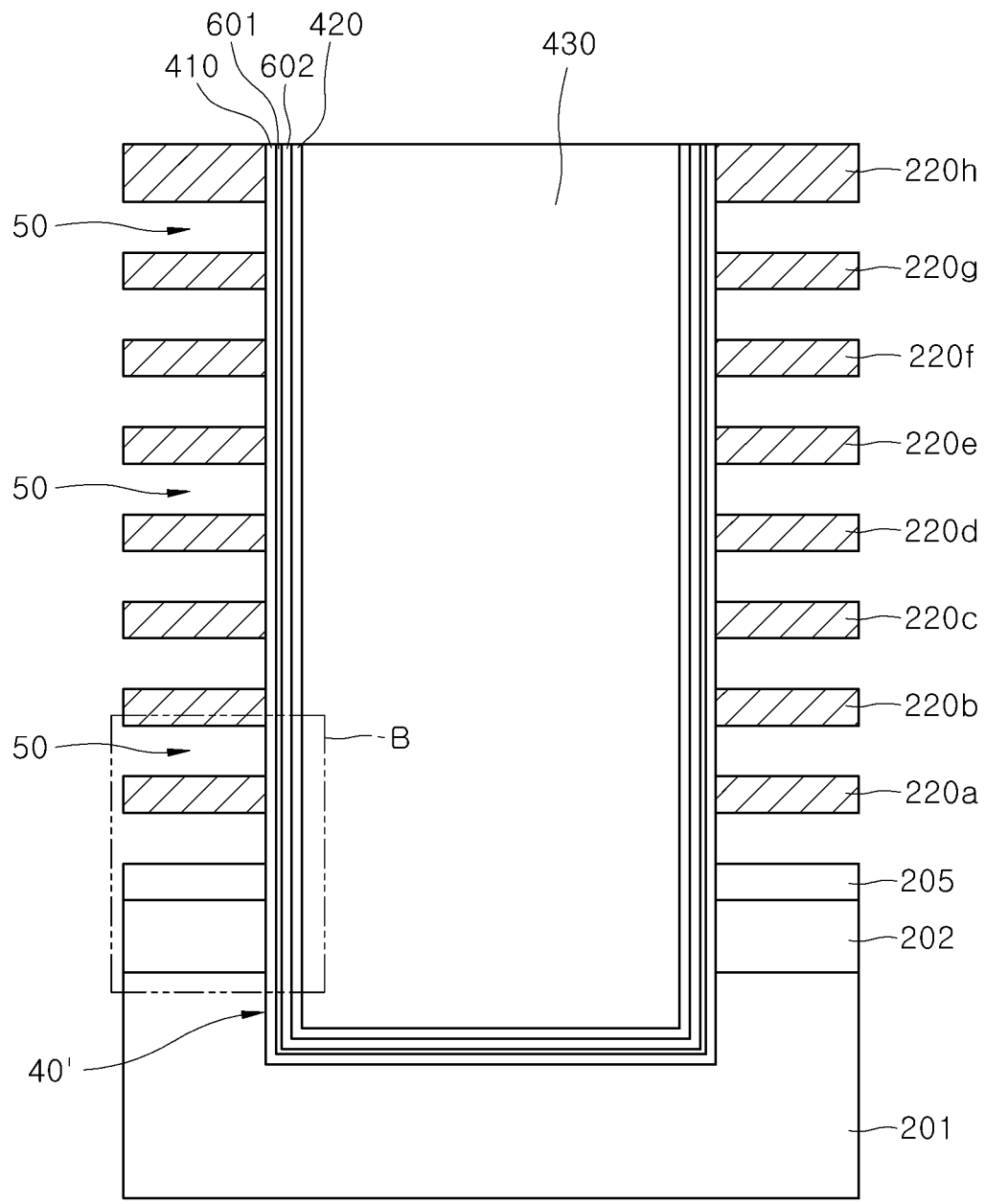
Figure 19B:
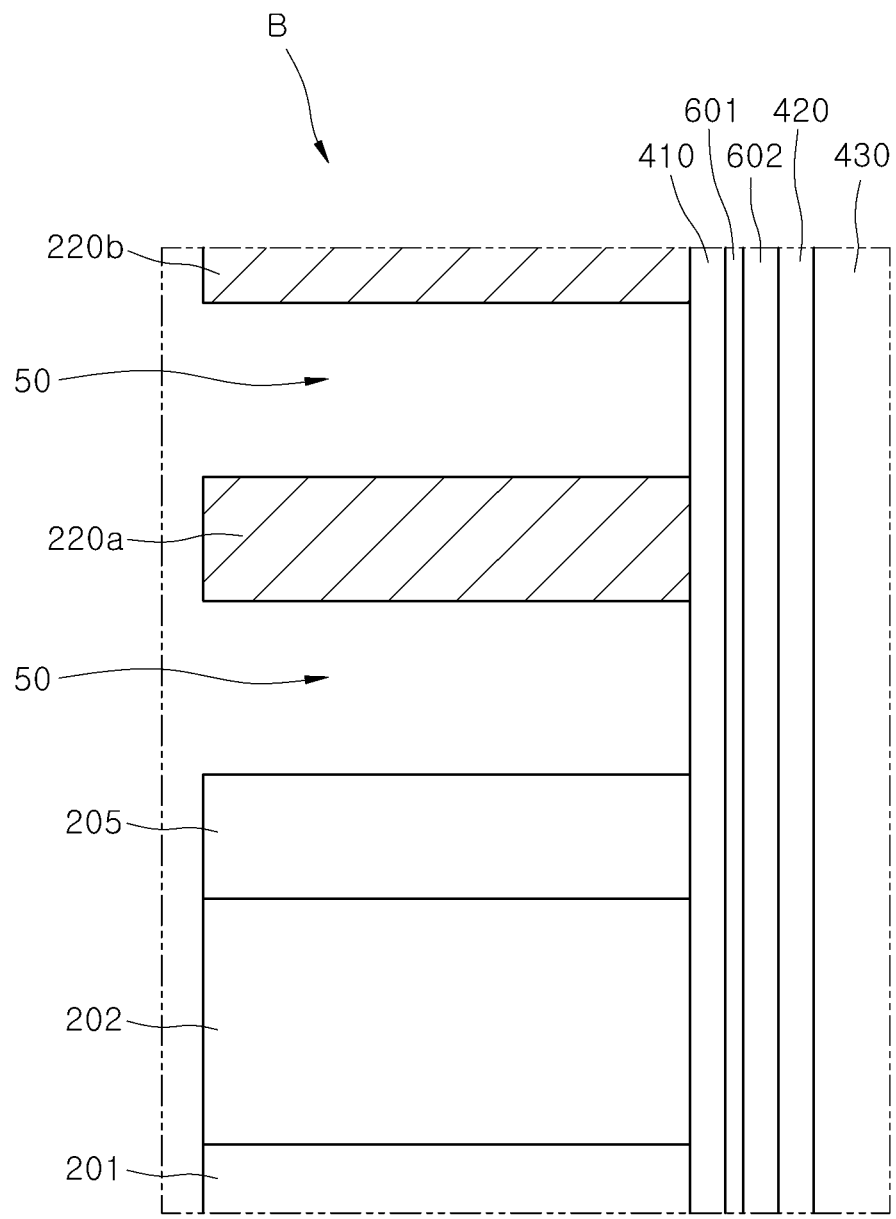

Referring to FIGS. 19A and 19B, the interlayer sacrificial layers 210a, 210b, 210c, 210d, 210e, 210f, 210g and 210h may be selectively removed to form recesses 50 selectively exposing the first to eighth interlayer insulation layers 220a, 220b, 220c, 220d, 220e, 220f, 220g and 220h and the first ferroelectric amorphous material layer 410. This process may be substantially the same as the process described above with reference to FIG. 11.

Figure 20A:
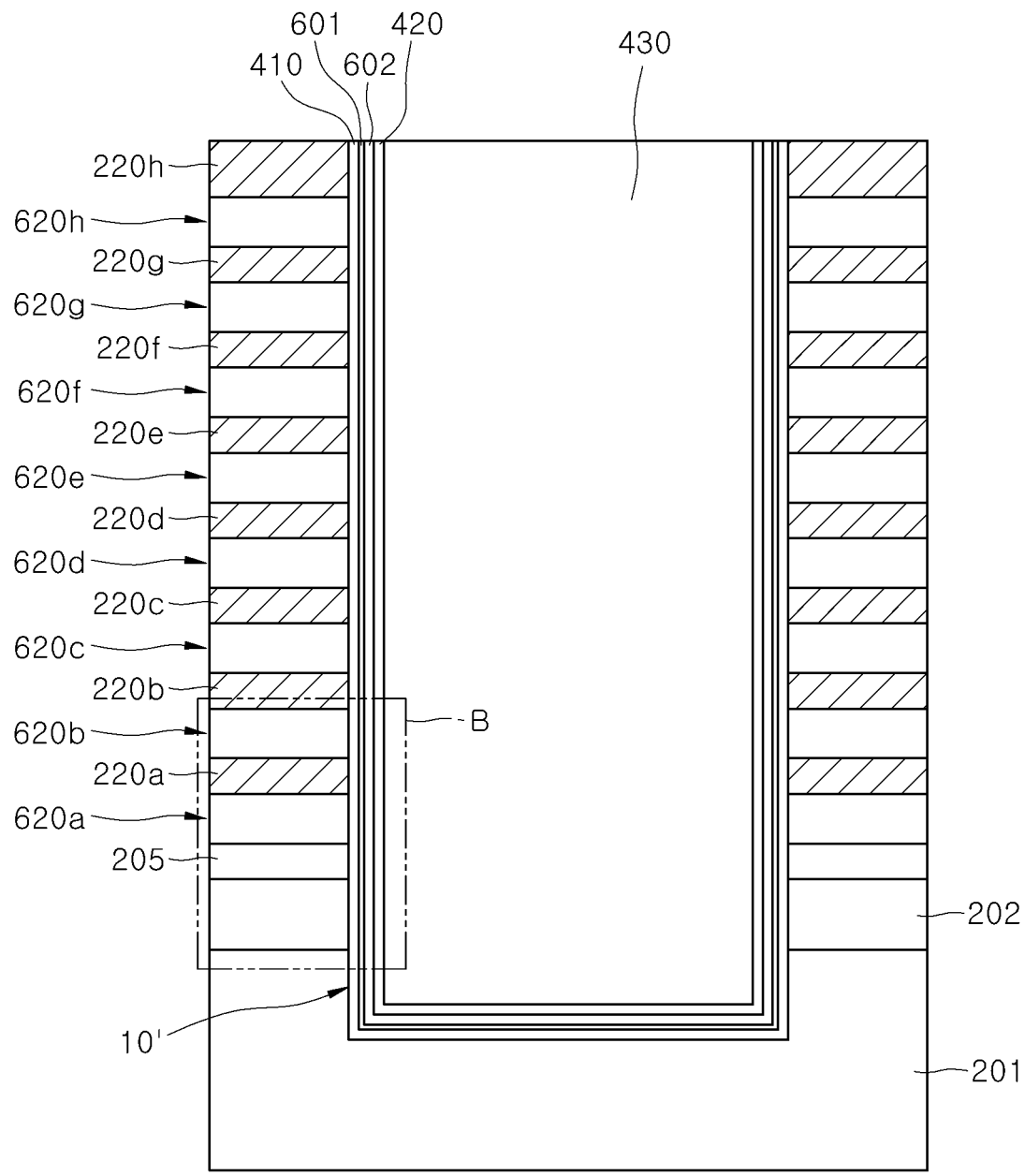
Figure 20B:
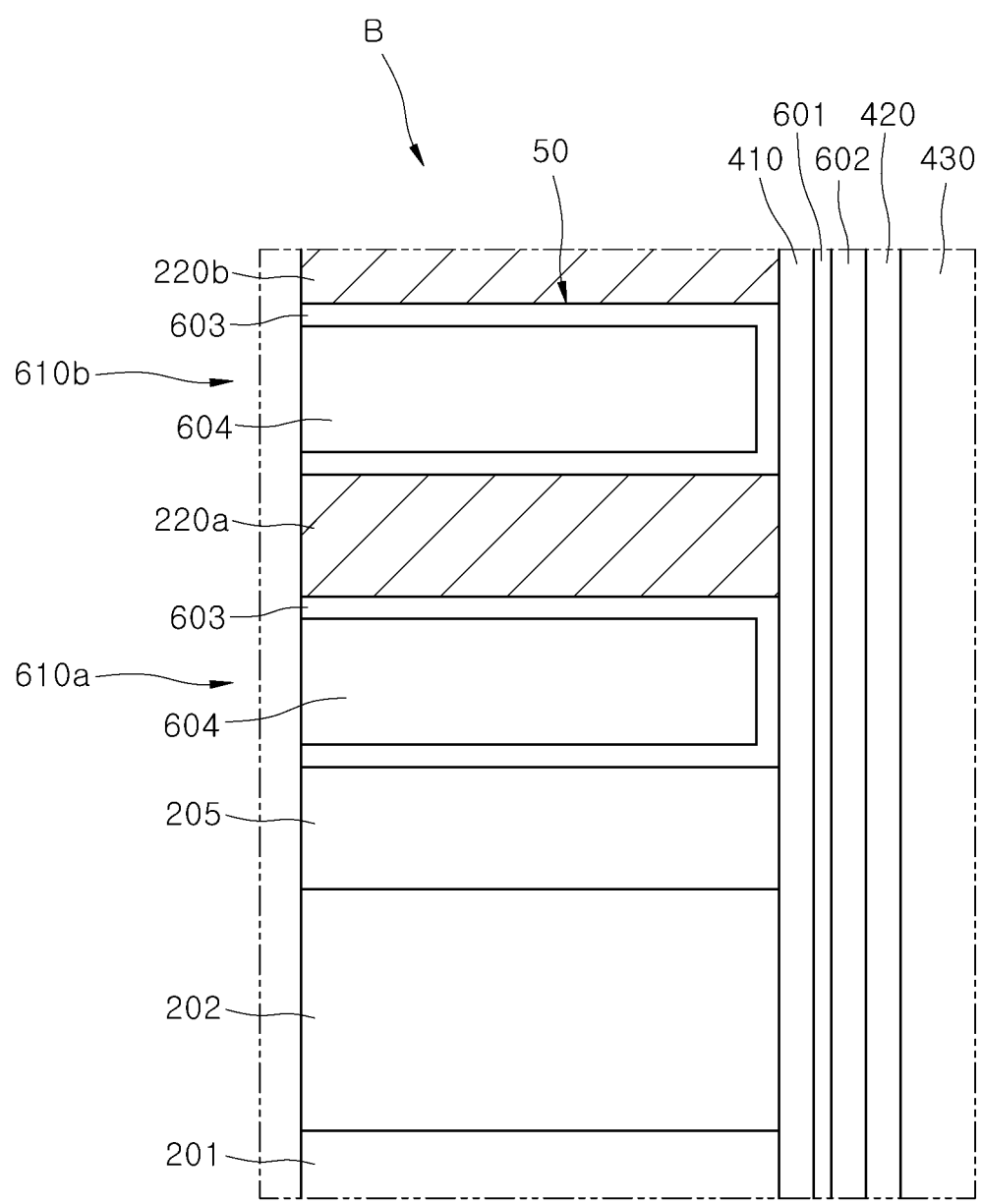
Figure 20B:
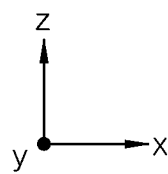

Referring to FIGS. 20A and 20B, a gate electrode layer 603 may be formed on the first ferroelectric amorphous material layer 410 and the first to eighth interlayer insulation layers 220a, 220b, 220c, 220d, 220e, 220f, 220g and 220h inside the recesses 50. In addition, a conductive layer 604 may be formed on the gate electrode layer 603. The conductive layer 604 may be formed to fill each the recess 50 in which the gate electrode layer 603 is formed. As a result, first to eighth gate structures 620a, 620b, 620c, 620d, 620e, 620f, 620g and 620h may be formed.

Figure 21A:
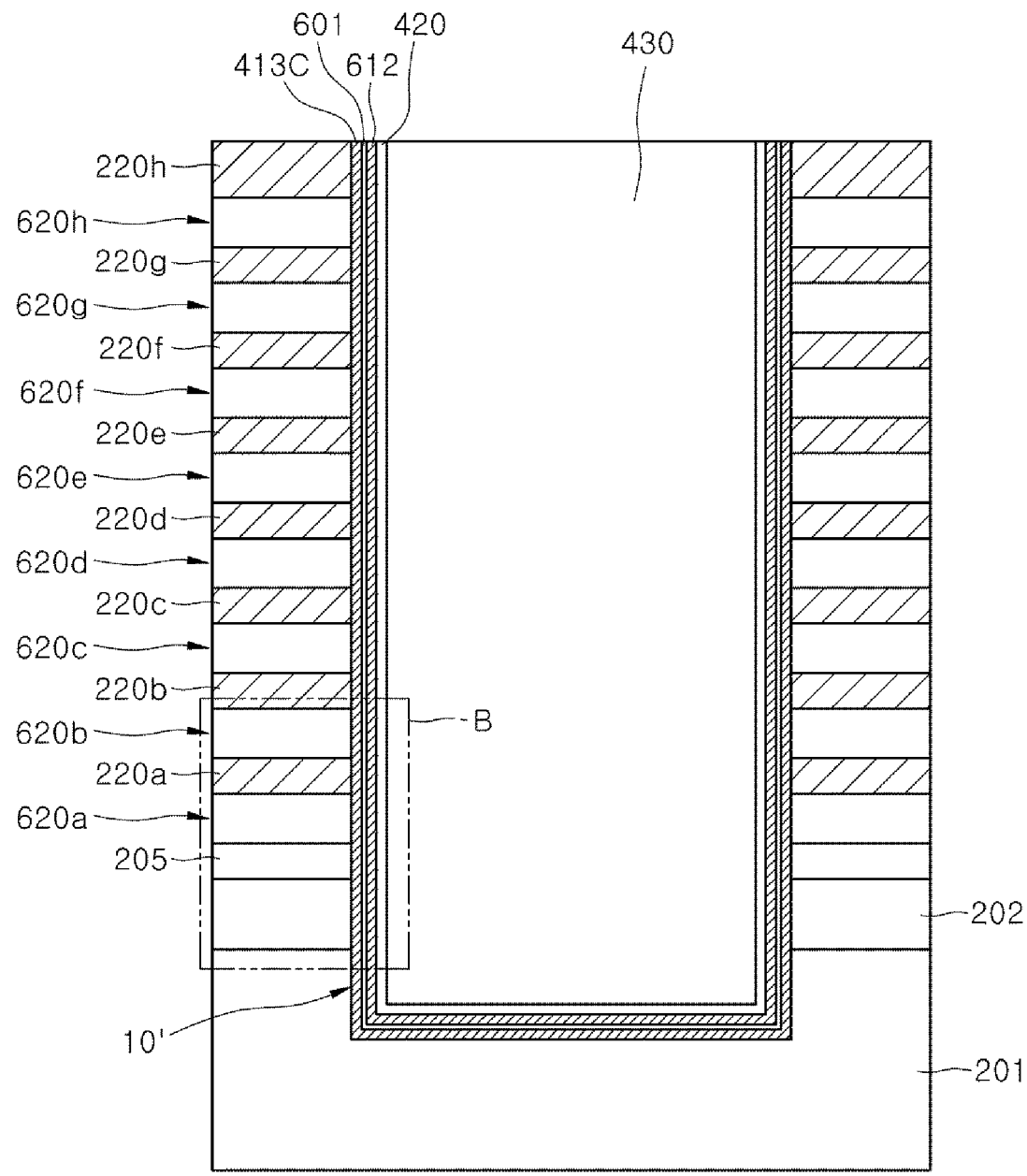
Figure 21B:
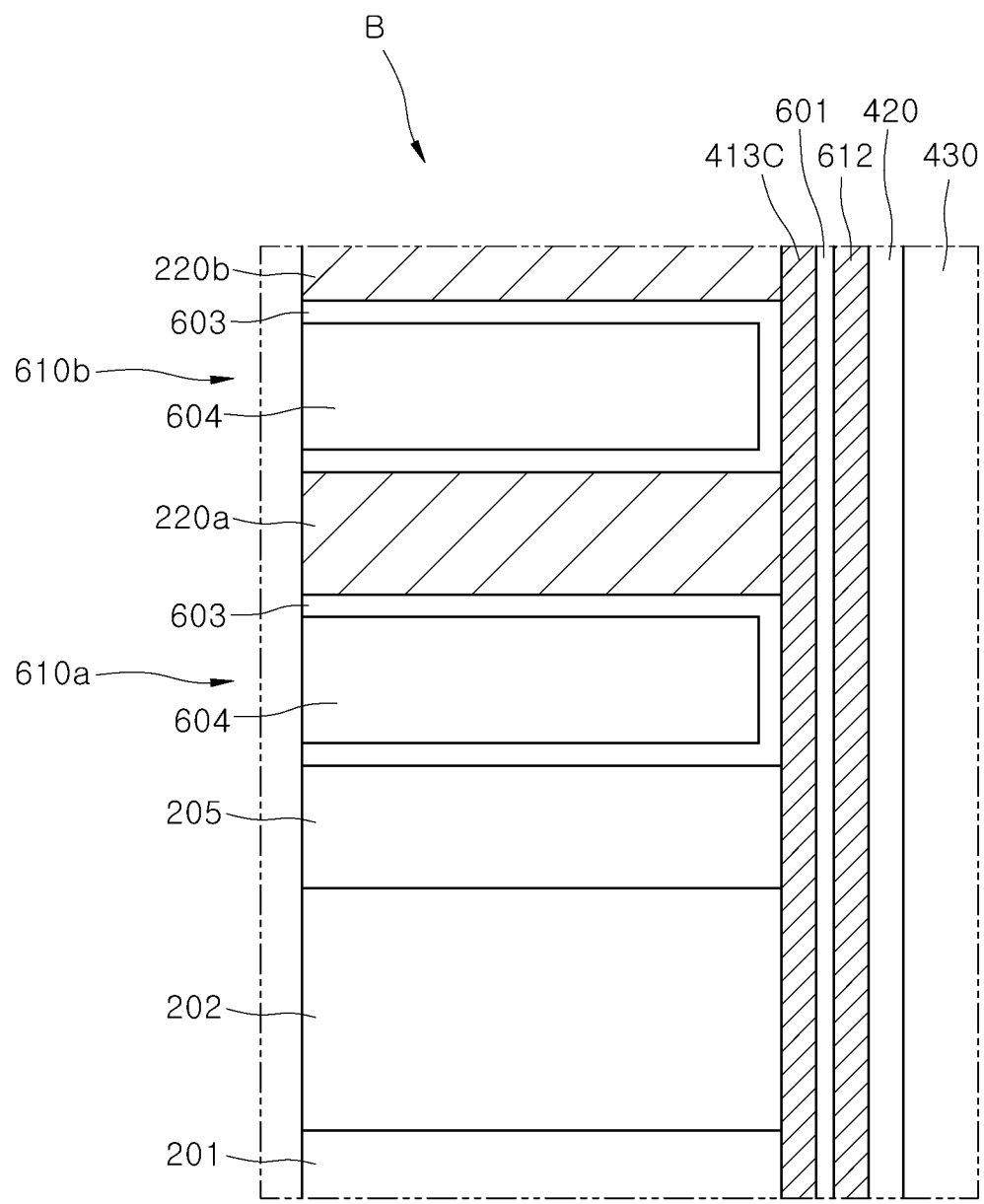

Referring to FIGS. 21A and 21B, crystallization heat treatment may be performed with respect to the first and second ferroelectric amorphous material layers 410 and 602 using the ferroelectric induction layer 601. The crystallization heat treatment process may include the process of heat-treating the first and second ferroelectric amorphous material layers 410 and 602 in contact with the ferroelectric induction layer 601 to develop a ferroelectric property in the resulting layers. As a result, as illustrated in FIGS. 21A and 21B, the first and second ferroelectric amorphous material layers 410 and 602 can be converted into crystalline first and second gate dielectric layers 413C and 612 having ferroelectric properties.

Figure 22A:
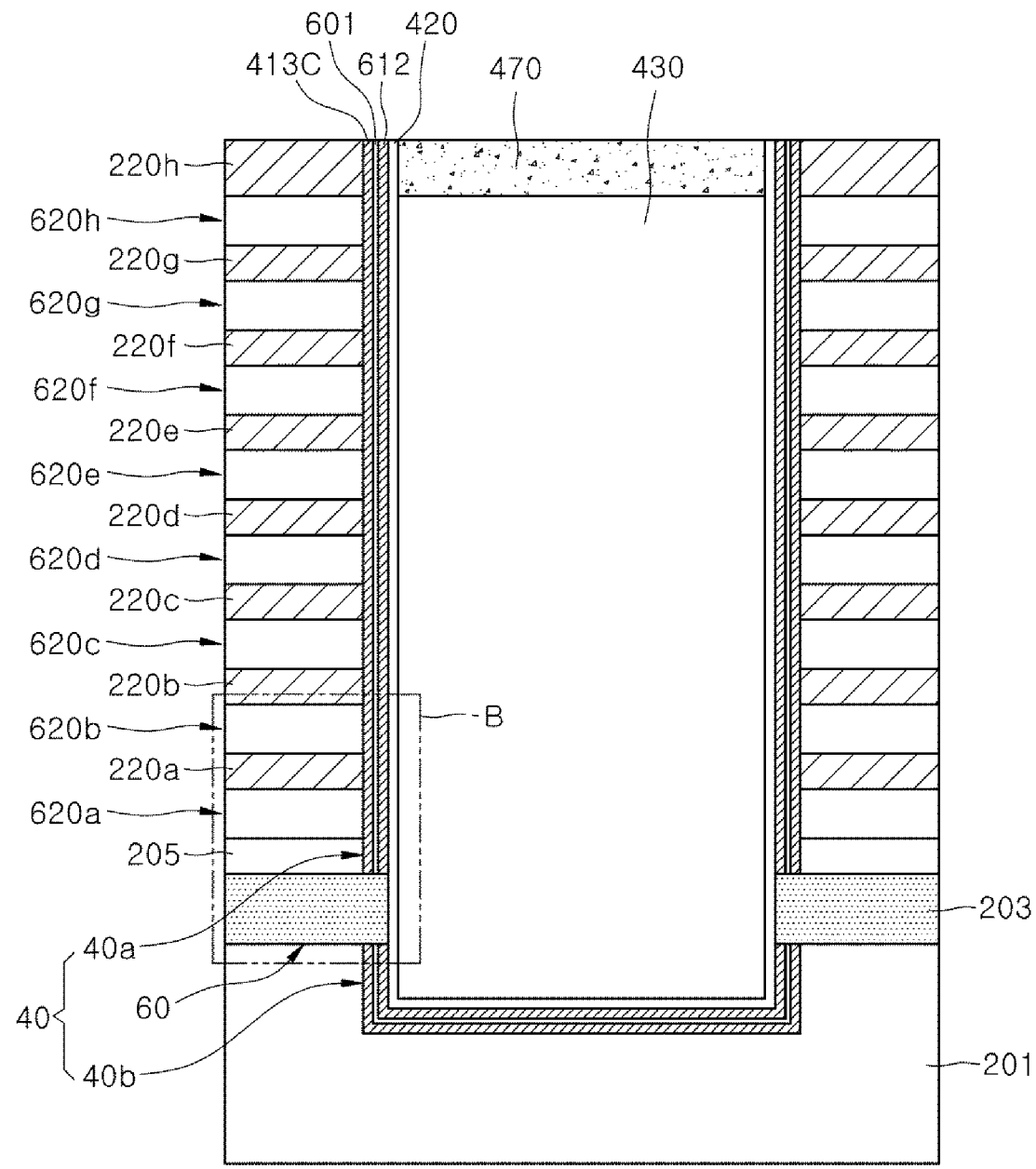
Figure 22B:
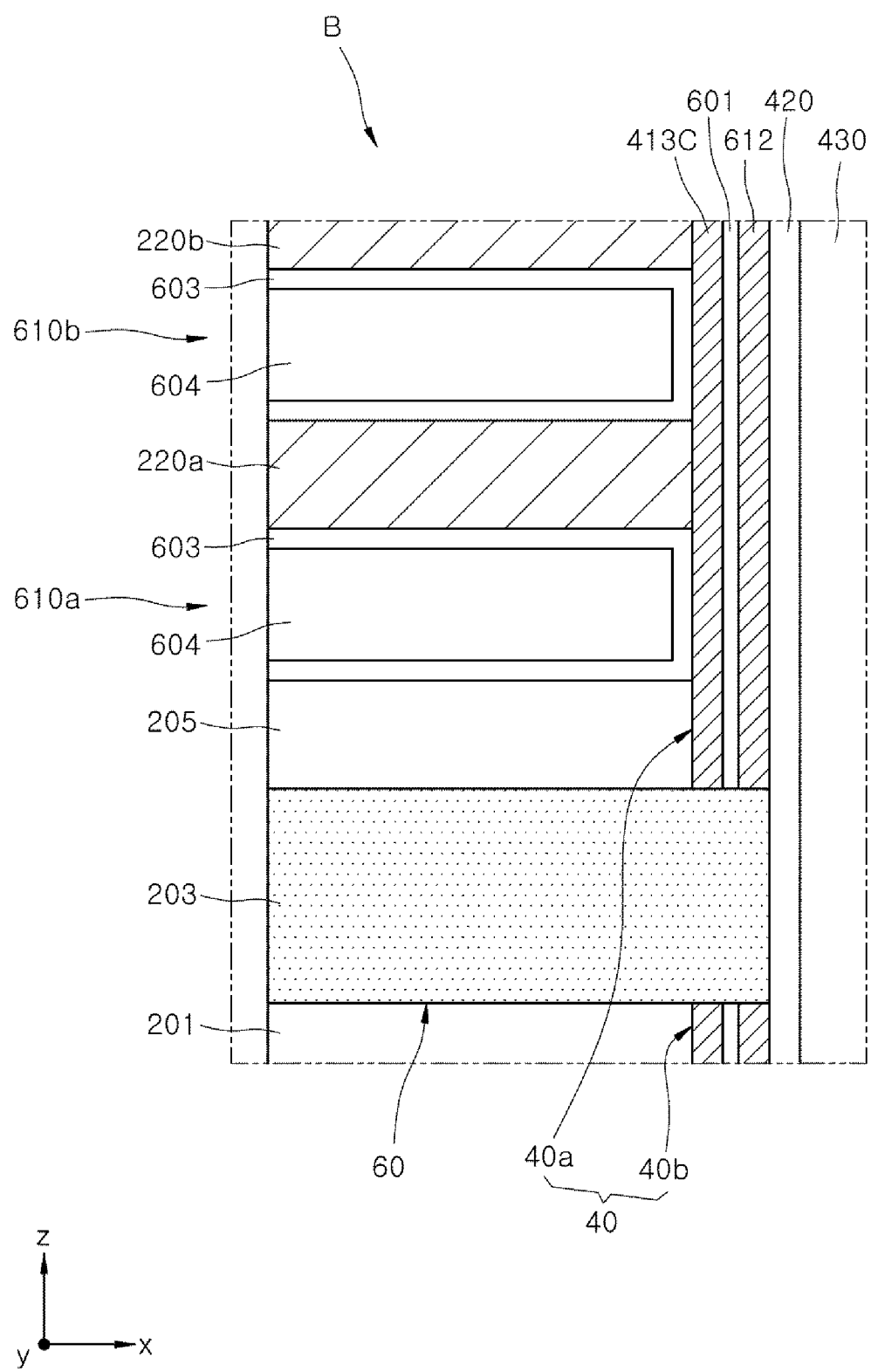

Referring to FIGS. 22A and 22B, the source insulation layer 205 may be selectively removed. And, the first gate dielectric layer 413C, the ferroelectric induction layer 601, and the second gate dielectric layer 612 may be additionally removed to form side recess spaces 60. As the side recess spaces 60 are formed, the trench 40' may be converted into a trench 40 including a first portion 40a and a second portion 40b that are separated from each other.

Then, the side recess spaces 60 may be filled with a conductive material to form a source contact layer 203. The conductive material may include, for example, semiconductor doped into n-type or p-type. As a specific example, the conductive material may be n-type doped silicon. The source contact layer 203 may be formed to contact a portion of the channel layer 420.

Referring to FIG. 22A, an upper portion of the filling insulation layer 430 may be selectively etched to form a recess. Then, the recess may be filled with a conductive material to form a channel contact layer 470.

Through the above-described process, a ferroelectric memory device according to an embodiment of the present disclosure can be manufactured. As described above, crystallization heat treatment may be performed with respect to the first and second ferroelectric amorphous material layers while a ferroelectric induction layer including an insulator is in contact with the first and second ferroelectric amorphous material layers, respectively. Accordingly, a crystalline gate dielectric layer having a ferroelectric property can be effectively secured from the first and second ferroelectric amorphous material layers.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A ferroelectric memory device comprising:
    a substrate;
    a channel layer over the substrate;
    a first gate dielectric layer disposed on the channel layer, the first gate dielectric layer comprising a ferroelectric portion and a non-ferroelectric portion;
    a ferroelectric induction layer disposed on the ferroelectric portion of the first gate dielectric layer, the ferroelectric induction layer including an insulator;
    an interlayer insulation layer disposed near the ferroelectric induction layer, the interlayer insulation layer contacting the non-ferroelectric portion of the first gate dielectric layer;
    a second gate dielectric layer disposed on the ferroelectric induction layer; and
    a gate electrode layer disposed on the second gate dielectric layer.

2. The ferroelectric memory device of claim 1, wherein the ferroelectric induction layer has a lattice constant different from a lattice constant of the first and second gate dielectric layers.

3. The ferroelectric memory device of claim 1,
wherein each of the first and second gate dielectric layers comprises at least one selected from the group consisting of hafnium oxide, zirconium oxide and hafnium zirconium oxide.

4. The ferroelectric memory device of claim 3,
wherein each of the first and second gate dielectric layers has a thickness of 5 nm to 15 nm, and
wherein the ferroelectric induction layer has a thickness of 1 nm to 5 nm.

5. The ferroelectric memory device of claim 1,
wherein the ferroelectric induction layer comprises crystalline magnesium oxide.

6. The ferroelectric memory device of claim 1,
wherein each of the first and second gate dielectric layers comprises at least one selected from the group consisting of silicon (Si), zirconium (Zr), yttrium (Y), aluminum (Al), gadolinium (Gd), strontium (Sr), and lanthanum (La) as a dopant.

7. The ferroelectric memory device of claim 1,
wherein the gate electrode layer has a lattice constant different from a lattice constant of the second gate dielectric layer.

8. A ferroelectric memory device comprising:
a substrate;
a gate stack disposed on the substrate, the gate stack comprising at least one gate structure and at least one interlayer insulation layer, which are alternately stacked in a direction perpendicular to the substrate;
a trench penetrating the gate stack to expose side surfaces of the gate structure and the at least one interlayer insulation layer;
a first gate dielectric layer disposed on an inner surface of the trench, the first gate dielectric layer comprising a ferroelectric portion and a non-ferroelectric portion; and
a channel layer disposed to cover the first gate dielectric layer,
wherein the gate structure comprises:
a ferroelectric induction layer in contact with the interlayer insulation layer and the first gate dielectric layer;
a second gate dielectric layer in contact with the ferroelectric induction layer; and
a gate electrode layer in contact with the second gate dielectric layer,
wherein the ferroelectric portion of the first gate dielectric layer contacts the ferroelectric induction layer, and
wherein the non-ferroelectric portion of the first gate dielectric layer contacts the interlayer insulation layer.

9. The ferroelectric memory device of claim 8,
wherein the ferroelectric induction layer comprises an insulator.

10. The ferroelectric memory device of claim 9,
wherein the ferroelectric induction layer comprises crystalline magnesium oxide.

11. The ferroelectric memory device of claim 8,
wherein each of the first and second gate dielectric layers comprises at least one selected from the group consisting of hafnium oxide, zirconium oxide and hafnium zirconium oxide.

12. The ferroelectric memory device of claim 8,
wherein the ferroelectric induction layer has a lattice constant different from a lattice constant of the first and second gate dielectric layers.

13. The ferroelectric memory device of claim 8,
wherein each of the first and second gate dielectric layers has a thickness of 5 nm to 15 nm in a direction perpendicular to a contact surface with the ferroelectric induction layer, and
wherein the ferroelectric induction layer has a thickness of 1 nm to 5 nm on the interlayer insulation layer and the first gate dielectric layer.

14. The ferroelectric memory device of claim 8,
wherein each of the first and second gate dielectric layers comprises at least one selected from the group consisting of silicon (Si), zirconium (Zr), yttrium (Y), aluminum (Al), gadolinium (Gd), strontium (Sr), and lanthanum (La) as a dopant.

* * * * *